(12) United States Patent
Lee et al.

(10) Patent No.: US 11,244,721 B2
(45) Date of Patent: Feb. 8, 2022

(54) MEMORY DEVICE FOR CONTROLLING UNSELECTED MEMORY CELLS IN ACCORDANCE WITH ADJACENCY TO SELECTED MEMORY CELL, AND METHOD FOR OPERATING THE SAME

(71) Applicant: SAMSUNG ELECTRONICS CO., LTD., Suwon-si (KR)

(72) Inventors: Dojeon Lee, Hwaseong-si (KR); Dueung Kim, Yongin-si (KR); Jin-Young Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/821,265

(22) Filed: Mar. 17, 2020

(65) Prior Publication Data

US 2021/0027835 A1 Jan. 28, 2021

(30) Foreign Application Priority Data

Jul. 26, 2019 (KR) .................. 10-2019-0091004

(51) Int. Cl.
*G11C 11/56* (2006.01)
*G11C 11/4074* (2006.01)
*G11C 11/4094* (2006.01)
*G11C 11/408* (2006.01)

(52) U.S. Cl.
CPC ...... *G11C 11/5628* (2013.01); *G11C 11/4074* (2013.01); *G11C 11/4085* (2013.01); *G11C 11/4087* (2013.01); *G11C 11/4094* (2013.01); *G11C 11/5642* (2013.01); *G11C 11/5678* (2013.01)

(58) Field of Classification Search
CPC ............. G11C 13/0004; G11C 13/003; G11C 13/0033; G11C 11/5642; G11C 11/5678; G11C 11/5628
See application file for complete search history.

(56) References Cited

U.S. PATENT DOCUMENTS

| 6,667,900 | B2 | 12/2003 | Lowrey et al. |
| 7,679,133 | B2 | 3/2010 | Son et al. |
| 7,929,335 | B2 | 4/2011 | Gopalakrishnan |
| 8,553,466 | B2 | 10/2013 | Han et al. |
| 8,559,235 | B2 | 10/2013 | Yoon et al. |
| 8,654,587 | B2 | 2/2014 | Yoon et al. |

(Continued)

FOREIGN PATENT DOCUMENTS

KR 10-1654135 9/2016

*Primary Examiner* — Alfredo Bermudez Lozada
(74) *Attorney, Agent, or Firm* — F. Chau & Associates, LLC

(57) ABSTRACT

A memory device includes a bay comprises a plurality of word lines, a plurality of bit lines, and a memory cell connected to a first word line of the plurality of word lines and a first bit line of the plurality of bit lines, a row decoder configured to bias at least one word line of the word lines adjacent to the first word line and float remaining non-adjacent word lines of the plurality of word lines not adjacent to the first word line, in an access operation associated with the memory cell, and a column decoder configured to bias at least one bit line of the bit lines adjacent to the first bit line and float remaining non-adjacent bit lines of the plurality of bit lines not adjacent to the first bit line, in the access operation.

20 Claims, 16 Drawing Sheets

(56) References Cited

U.S. PATENT DOCUMENTS

| | | | |
|---|---|---|---|
| 8,737,151 B2 | 5/2014 | Bateman et al. | |
| 9,036,398 B2 | 5/2015 | Park et al. | |
| 9,129,675 B2 | 9/2015 | Baek et al. | |
| 9,183,932 B1 * | 11/2015 | Kwon | G11C 11/1673 |
| 9,460,794 B2 | 10/2016 | Maejima et al. | |
| 10,311,921 B1 * | 6/2019 | Parkinson | G11C 7/06 |
| 2011/0044090 A1 * | 2/2011 | Terada | G11C 8/08 |
| | | | 365/148 |
| 2011/0233648 A1 | 9/2011 | Seol et al. | |
| 2014/0169089 A1 * | 6/2014 | Castro | G11C 13/0038 |
| | | | 365/163 |
| 2019/0304540 A1 * | 10/2019 | Park | G11C 13/0033 |

\* cited by examiner

MEMORY DEVICE FOR CONTROLLING UNSELECTED MEMORY CELLS IN ACCORDANCE WITH ADJACENCY TO SELECTED MEMORY CELL, AND METHOD FOR OPERATING THE SAME

CROSS-REFERENCE TO RELATED APPLICATIONS

This U.S. non-provisional patent application claims priority under 35 U.S.C. § 119 to Korean Patent Application No. 10-2019-0091004 filed on Jul. 26, 2019, in the Korean Intellectual Property Office, the disclosure of which is incorporated by reference in its entirety herein.

BACKGROUND

1. Technical Field

Embodiments of the inventive concept described herein relate to a memory device, and more particularly relate to a nonvolatile memory device for controlling unselected memory cells depending on adjacency to a selected memory cell and a method for operating the nonvolatile memory device.

2. Discussion of Related Art

A semiconductor memory may include a nonvolatile such as a phase-change memory, a ferroelectric memory, a magnetic memory, a resistive memory, and a flash memory.

In particular, among the nonvolatile memories, the phase-change memory performs a write operation by changing resistance values of memory cells through application of a current and performs a read operation through application of another current.

When the read operation or the write operation is performed on a selected memory cell, an off current may flow into an unselected memory cell adjacent to the selected memory cell due to leakage of a program current. However, the leakage of the program current reduces a sensing margin of the selected memory cell.

SUMMARY

At least one embodiments of the inventive concept provides a nonvolatile memory device for controlling unselected memory cells depending on adjacency to selected memory cells and a method for operating the nonvolatile memory device.

According to an exemplary embodiment of the inventive concept, a memory device includes a bay that comprises a plurality of word lines, a plurality of bit lines, and a memory cell connected to a first word line of the plurality of word lines and a first bit line of the plurality of bit lines, a row decoder configured to bias at least one word line of the word lines adjacent to the first word line to a level of a first non-selection row voltage and floats remaining non-adjacent word lines of the plurality of word lines not adjacent to the first word line to a level of a second non-selection row voltage, in an access operation associated with the memory cell, and a column decoder configured to bias at least one bit line of the bit lines adjacent to the first bit line to a level of a first non-selection column voltage and floats remaining non-adjacent bit lines of the plurality of bit lines not adjacent to the first bit line to a level of a second non-selection column voltage, in the access operation.

According to an exemplary embodiment of the inventive concept, a memory device includes a memory cell array that includes first to third word lines, first to third bit lines, and a memory cell connected to the first word line and the first bit line, wherein the second word line is interposed between the first and third word lines and the second bit line is interposed between the first and third bit lines, a row driver configured to output a first selection row voltage and first and second non-selection row voltages, a column driver configured to output a first selection column voltage and first and second non-selection column voltages, a row decoder configured to apply the first selection row voltage to the first word line, bias the second word line to a level of the first non-selection row voltage, and float the third word line to a level of the second non-selection row voltage, in a write operation, a column decoder configured to apply the first selection column voltage to the first bit line, bias the second bit line to a level of the first non-selection column voltage, and float the third bit line to a level of the second non-selection column voltage, in a read operation, a sense amplifier configured to sense a level of a read voltage of the first word line in the read operation.

According to an exemplary embodiment of the inventive concept, a method of performing a read operation on a memory cell of a memory device connected to a first word line and a first bit line includes: precharging the first word line to a level of a first selection row voltage, floating the first word line, precharging the first bit line to a level of a first selection column voltage, biasing the second bit line to a level of a first non-selection column voltage and floating the third bit line to a level of a second non-selection column voltage, floating the first bit line, and sensing a level of a read voltage of the first word line.

BRIEF DESCRIPTION OF THE FIGURES

The inventive concept will become apparent by describing in detail exemplary embodiments thereof with reference to the accompanying drawings.

DETAILED DESCRIPTION OF THE EXEMPLARY EMBODIMENTS

Below, exemplary embodiments of the inventive concept will be described in detail and clearly to such an extent that one of ordinary skill in the art can implement the inventive concept.

Figure 1:
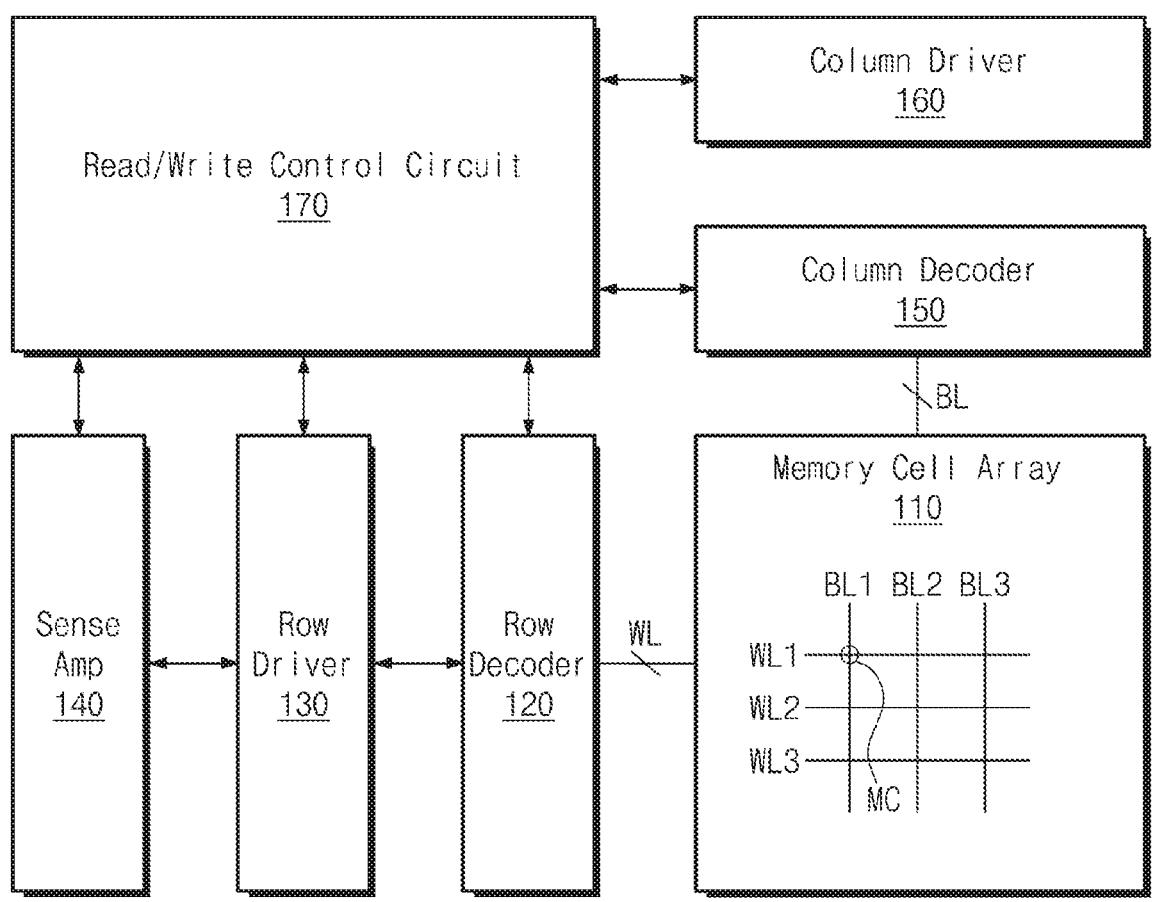
FIG. 1 is a block diagram illustrating a memory device according to an exemplary embodiment of the inventive concept.

FIG. 1 is a block diagram illustrating a memory device according to an exemplary embodiment of the inventive concept. A memory device 100 includes a memory cell array 110, a row decoder 120 (e.g., a decoder circuit), a row driver 130 (e.g., a driver circuit), a sense amplifier 140, a column decoder 150 (e.g., a decoder circuit), a column driver 160 (e.g., a driver circuit), and a read/write control circuit 170.

The memory cell array 110 may include first to third word lines WL1 to WL3 and first to third bit lines BL1 to BL3. The second word line WL2 is interposed between the first and third word lines WL1 and WL3, and the second bit line BL2 is interposed between the first and third bit lines BL1 and BL3. For example, the memory cell array 110 may be a cross point memory cell array. The memory cell array 110 may include a memory cell MC connected between the first word line WL1 and the first bit line BL1. The memory cell MC may be a dynamic random access memory (DRAM) cell, a static RAM (SRAM) cell, a phase-change RAM (PRAM) cell, a resistance RAM (ReRAM) cell, a ferroelectric RAM (FeRAM) cell, a thyristor RAM (TRAM) cell, or a magnetic RAM (MRAM) cell, but the inventive concept is not limited thereto. The number of word lines WL1 to WL3 and the number of bit lines BL1 to BL3 are only an example. For example, there may be more or less than three word lines and more or less than three bit lines.

The row decoder 120 may apply word line voltages to the first to third word lines WL1 to WL3 in the read operation or the write operation of the memory device 100. The row decoder 120 may precharge the first to third word lines WL1 to WL3 using the applied word line voltages. Voltages to be applied to the first to third word lines WL1 to WL3 may be output from the row driver 130, and the row decoder 120 may selectively apply the voltages to the first to third word lines WL1 to WL3. The row decoder 120 may bias or float the first to third word lines WL1 to WL3 in the read operation or the write operation of the memory device 100. The row driver 130 may drive the first to third word lines WL1 to WL3. The row driver 130 may output voltages to be applied to the first to third word lines WL1 to WL3. The row decoder 120 may bias the first to third word lines WL1 to WL3 so as to be set to levels (or voltage levels) of the voltages output from the row driver 130. The row decoder 120 may float the first to third word lines WL1 to WL3 at the levels of the voltages output from the row driver 130.

In the read operation, the sense amplifier 140 senses a level of a read voltage of one more of the first to third word lines WL1 to WL3 (or levels of read currents thereof). A sensing result of the sense amplifier 140 may indicate data stored in the memory cell array 110. For example, the sense amplifier 140 may compare the read voltage against a reference voltage to determine a state of a memory cell in the memory cell array, and the state may indicate a value of the data. The sense amplifier 140 may be selectively connected to the first to third word lines WL1 to WL3 through the row decoder 120 and the row driver 130. The selective connection between the sense amplifier 140 and the first to third word lines WL1 to WL3 will be more fully described together with detailed components of the row driver 130 illustrated in FIG. 8.

The column decoder 150 may apply bit line voltages to the first to third bit lines BL1 to BL3 in the read operation or the write operation of the memory device 100. The column decoder 150 may precharge the first to third bit lines BL1 to BL3 with the applied bit line voltages. Voltages to be applied to the first to third bit lines BL1 to BL3 may be output from the column driver 160, and the column decoder 150 may selectively apply the voltages to the first to third bit lines BL1 to BL3. The column decoder 150 may bias or float the first to third bit lines BL1 to BL3 in the read operation or the write operation of the memory device 100. The column driver 160 may drive the first to third bit lines BL1 to BL3. The column driver 160 may output voltages to be applied to the first to third bit lines BL1 to BL3. The column decoder 150 may bias the first to third bit lines BL1 to BL3 to levels of the voltages output from the column driver 160. The column decoder 150 may float the first to third bit lines BL1 to BL3 at the levels of the voltages output from the column driver 160.

The read/write control circuit 170 controls the row decoder 120, the row driver 130, the sense amplifier 140, the column decoder 150, and the column driver 160. The read/write control circuit 170 may control the biasing or floating of the first to third word lines WL1 to WL3 by the row decoder 120 and may control the biasing or floating of the first to third bit lines BL1 to BL3 by the column decoder 150. For example, when the memory cell MC connected to the first word line WL1 and the first bit line BL1 is a selected memory cell (or a read target cell or a write target cell), the read/write control circuit 170 may allow the row decoder 120 to bias the second word line WL2 (or an adjacent word line) adjacent to the first word line WL1, may allow the row decoder 120 to float the third word line WL3 (or a non-adjacent word line) not adjacent to the first word line WL1, may allow the column decoder 150 to bias the second bit line BL2 (or an adjacent bit line) adjacent to the first bit line BL1, and may allow the column decoder 150 to float the third bit line BL3 (or a non-adjacent bit line) not adjacent to the first bit line BL1.

The read/write control circuit 170 may allow the row decoder 120 to selectively bias or float the first to third word lines WL1 to WL3 and may allow the column decoder 150 to selectively bias or float the first to third bit lines BL1 to BL3. The read/write control circuit 170 may control voltages that are output by the row driver 130 or the column driver 160. The read/write control circuit 170 may allow the row decoder 120 to selectively apply the word line voltages to the first to third word lines WL1 to WL3 and may allow the column decoder 150 to selectively apply the bit line voltages to the first to third bit lines BL1 to BL3. In the read operation or the write operation, the read/write control circuit 170 may control levels of voltages to be applied to the first to third word lines WL1 to WL3 and the first to third bit lines BL1 to BL3, times to apply the voltages, and an order of applying the voltages.

In the read operation of the memory device 100, when a memory cell MC (or a selected memory cell) connected to the first word line WL1 (or a selected word line) and the first bit line BL1 (or a selected bit line) is a read target cell, the read/write control circuit 170 may allow the column decoder 150 to apply a selection voltage (or a selection column voltage) output from the column driver 160 to the first bit line BL1 connected to the memory cell MC. The selection voltage may be of a level of a voltage for precharging the first bit line BL1, and the precharging in the read operation will be described with reference to FIGS. 5A and 5B below. The column driver 160 may output non-selection column voltages (or biasing voltages or floating voltages) for biasing or floating the unselected bit lines BL2 and BL3. In the read operation, the column decoder 150 may bias or float the second and third bit lines BL2 and BL3 at levels of the non-selection column voltages. The sense amplifier 140 may sense a level of the read voltage of the first word line WL1, which is determined depending on a current of the memory cell MC responding to the selection voltage. The read/write control circuit 170 may read data stored in the selected memory cell MC based on a sensing result of the sense amplifier 140. For example, the sensing result may be compared against a reference voltage to determine a value of the read data.

In the write operation of the memory device 100, when a memory cell MC (or a selected memory cell) connected to the first word line WL1 (or a selected word line) and the first bit line BL1 (or a selected bit line) is a write target cell, the read/write control circuit 170 may allow the row decoder 120 to apply a selection voltage (or a selection row voltage) output from the row driver 130 to the first word line WL1 connected to the memory cell MC. The selection voltage may be of a level of a voltage for precharging the first word line WL1, and the precharging in the write operation will be described with reference to FIGS. 7A and 7B below. The row driver 130 may output non-selection row voltages (or biasing voltages or floating voltages) for biasing or floating the unselected word lines WL2 and WL3. In the write operation, the row decoder 120 may bias or float the second and third word lines WL2 and WL3 at levels of the non-selection row voltages. The selected memory cell MC may store data in response to the selection voltage.

Figure 2:
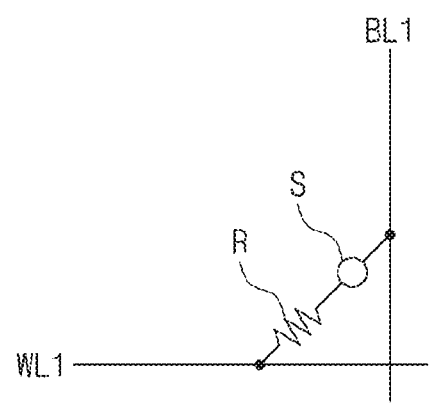
FIG. 2 is a circuit diagram illustrating a memory cell of a memory cell array of FIG. 1.

FIG. 2 is a circuit diagram illustrating a memory cell of a memory cell array of FIG. 1. Referring to FIG. 2, the memory cell MC may include a resistance element "R" and a selection element "S" connected to the word line WL1 and the bit line BL1.

In an exemplary embodiment, the resistance element "R" includes a phase change material whose state varies depending on an amount of current applied thereto. The phase change material may have a high resistance state corresponding to an amorphous state or a low resistance state corresponding to a crystalline state, depending on an electrical signal, Joule's heat, or a temperature applied to the memory cell MC1. For example, the resistance element "R" may include chalcogenide materials (e.g., Ge2Sb2Te5 (GST)).

The selection element "S" may control a current that is supplied to the resistance element "R", based on voltages applied to the bit line BL1 and the word line WL1. The selection element "S" may be connected between the resistance element "R" and the bit line BL1, and the resistance element "R" may be connected between the word line WL1 and the selection element "S". A location of the selection element "S" and a location of the resistance element "R" may be interchanged. For example, the selection element "S" may be a diode element or an ovonic threshold switch (OTS) element having a bidirectional characteristic, and the selection element "S" may include chalcogenide materials. The OTS element may be characterized by a threshold voltage (Vth illustrated in FIG. 9 below) and a switching voltage (Vs illustrated in FIG. 9 below). That is, the threshold voltage and the switching voltage may be unique parameters of the OTS element. In the case where the selection element "S" is the OTS element, the performance of the memory device 100 may be reduced due to a leakage current flowing at the memory cell MC.

Figure 3:
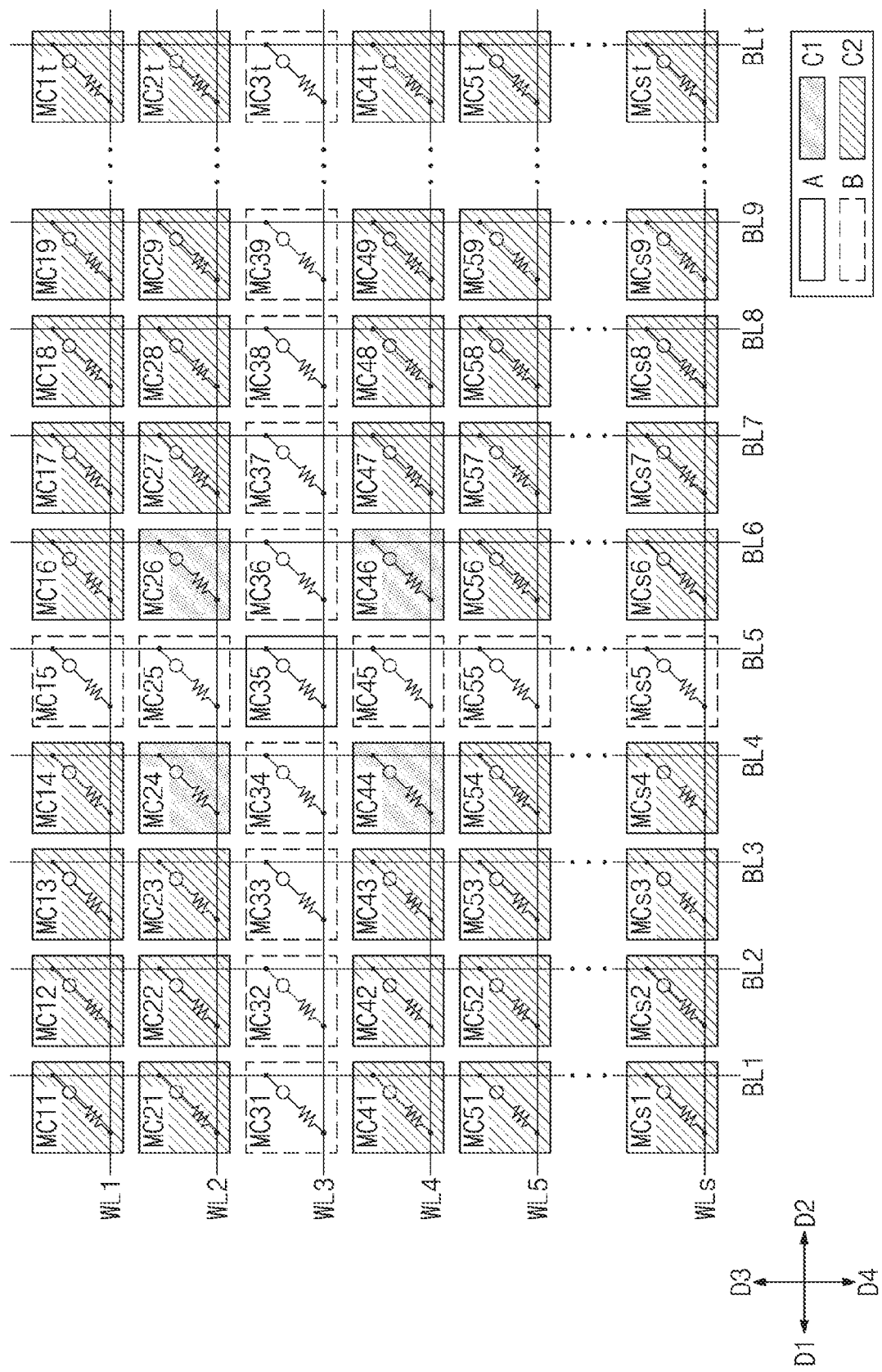
FIG. 3 is a block diagram illustrating an example of a memory cell array included in a memory device of FIG. 1.

FIG. 3 is a block diagram illustrating an example of a memory cell array included in a memory device of FIG. 1. FIG. 3 will be described with reference to FIG. 1. A memory cell array 110a includes first to s-th word lines WL1 to WLs (s being an integer of 6 or more), first to t-th bit lines BL1 to BLt (t being an integer of 10 or more), and memory cells MC11 to MCst (e.g., MC11 to MC1t, MC21 to MC2t, MC31 to MC3t, MC41 to MC4t, MC51 to MC5t, MCs1 to MCst). FIG. 3 is for describing a reference of dividing the plurality of memory cells MC11 to MCst in the read operation or the write operation. However, the inventive concept is not limited thereto as illustrated number of memory cells MC11 to MCst, the number of word lines WL1 to WLs, and the number of bit lines BL1 to BLt are only an example.

In the read operation or the write operation of the memory device 100, the bit line BL5 and the word line WL3 are a selected bit line and a selected word line, respectively. The bit line BL4 is adjacent to the selected bit line BL5 in direction D1. The bit line BL6 is adjacent to the selected bit line BL5 in direction D2. The word line WL2 is adjacent to the selected word line WL3 in direction D3. The word line WL4 is adjacent to the selected word line WL3 in direction D4.

In the read operation or the write operation of the memory device 100, the row decoder 120 may bias the word lines WL2 and WL4 so as to be set to a level of a voltage output from the row driver 130 and may float the word lines WL1 and WL5 to WLs at a level of a voltage output from the row driver 130. In the read operation or the write operation of the memory device 100, the column decoder 150 may bias the bit lines BL4 and BL6 so as to be set to a level of a voltage output from the column driver 160 and may float the bit lines BL1 to BL3 and BL7 to BLt at a level of a voltage output from the column driver 160. That is, the number of word lines WL2 and WL4 biased from among the unselected word lines WL1, WL2, and WL4 to WLs may be 2, and the number of bit lines BL4 and BL6 biased from among the unselected bit lines BL1 to BL4 and BL6 to BLt may be 2. However, the inventive concept is not limited to the above numerical values.

In FIG. 3, the plurality of memory cells MC11 to MCst includes A memory cell MC35, B memory cells MC15, MC25, MC31 to MC34, MC36 to MC3t, and MC45 to MCs5, C1 memory cells MC24, MC26, MC44, and MC46, and C2 memory cells MC11 to MC14, MC16 to MC1t, MC21 to MC23, MC27 to MC2t, MC41 to MC43, MC47 to MC4t, MC51 to MC54, MC56 to MC5t, MCs1 to MCs4, and MCs6 to MCst. The A memory cell MC35 is a selected memory cell. The A memory cell MC35 id connected to the selected word line WL3 and the selected bit line BL5. The memory device 100 id configured to read data from the A memory cell MC35 or to write data to the A memory cell MC35.

The B memory cells MC15, MC25, MC31 to MC34, MC36 to MC3t, and MC45 to MCs5 are connected to unselected word lines WL1, WL2, and WL4 to WLs and the selected bit line BL5 or connected to the selected word line WL3 and unselected bit lines BL1 to BL4 and BL6 to BLt. The B memory cells MC15, MC25, MC31 to MC34, MC36 to MC3t, and MC45 to MCs5 include the memory cells MC34 and MC36 connected to the selected word line WL3 and the biased bit lines BL4 and BL6, the memory cells MC31 to MC33 and MC37 to MC3t connected to the selected word line WL3 and the floated bit lines, BL1 to BL3 and BL7 to BLt, the memory cells MC25 and MC45 connected to the selected bit line BL5 and the biased word lines WL2 and WL4, and the memory cells MC15 and MC55 to MCs5 connected to the selected bit line BL5 and the floated word lines WL1 to WL5 to WLs.

The C1 memory cells MC24, MC26, MC44, and MC46 and the C2 memory cells MC11 to MC14, MC16 to MC1t, MC21 to MC23, MC27 to MC2t . . . MCs1 to MCs4, and MCs6 to MCst are connected to the unselected word lines WL1, WL2, WL4 to WLs and the unselected bit lines BL1 to BL4 and BL6 to BLt. The C1 memory cells MC24, MC26, MC44, and MC46 are connected to the biased word lines WL2 and WL4 and the biased bit lines BL4 and BL6. The C2 memory cells MC11 to MC14, MC16 to MC1t, MC21 to MC23, MC27 to MC2t . . . MCs1 to MCs4, and MCs6 to MCst include the memory cells MC21 to MC23, MC27 to MC2t, MC41 to MC43, and MC47 to MC4t connected to the biased word lines WL2 and WL4 and the floated bit lines BL1 to BL3 and BL7 to BLt, the memory cells MC14, MC16, MC54, MC56 . . . MCs4, and MCs6 connected to the floated word lines WL1 and WL5 to WLs and the biased bit lines BL4 and BL6, and the memory cells MC11 to MC13, MC17 to MC1t, MC51 to MC53, MC57 to MC5t . . . MCs1 to MCs3, and MCs7 to MCst connected to the floated word lines WL1 and WL5 to WLs and the floated bit lines BL1 to BL3 and BL7 to BLt.

Due to the leakage of a current flowing at the selected memory cell MC35 in the read operation or the write operation, an off current (or a leakage current) may flow to cross unselected memory cells (the remaining memory cells other than the memory cell MC35) in the memory cell array 110. As illustrated in FIG. 3, a leak current crossing the unselected memory cells may be markedly reduced by biasing the unselected word lines WL2 and WL4 adjacent (or the most adjacent, neighboring, or the most neighboring) to the selected word line WL3 and the unselected bit lines BL4 and BL6 adjacent (or the most adjacent, neighboring, or the most neighboring) to the selected bit line BL5 and by floating the remaining unselected word lines WL1 and WL5 to WLs (or the remaining non-adjacent word lines) and the remaining unselected bit lines BL1 to BL3 and BL7 to BLt (or the remaining non-adjacent bit lines). Also, power consumption of the memory device 100 for the biasing may be reduced by minimizing the number of biased word lines and the number of biased bit lines.

Figure 4:
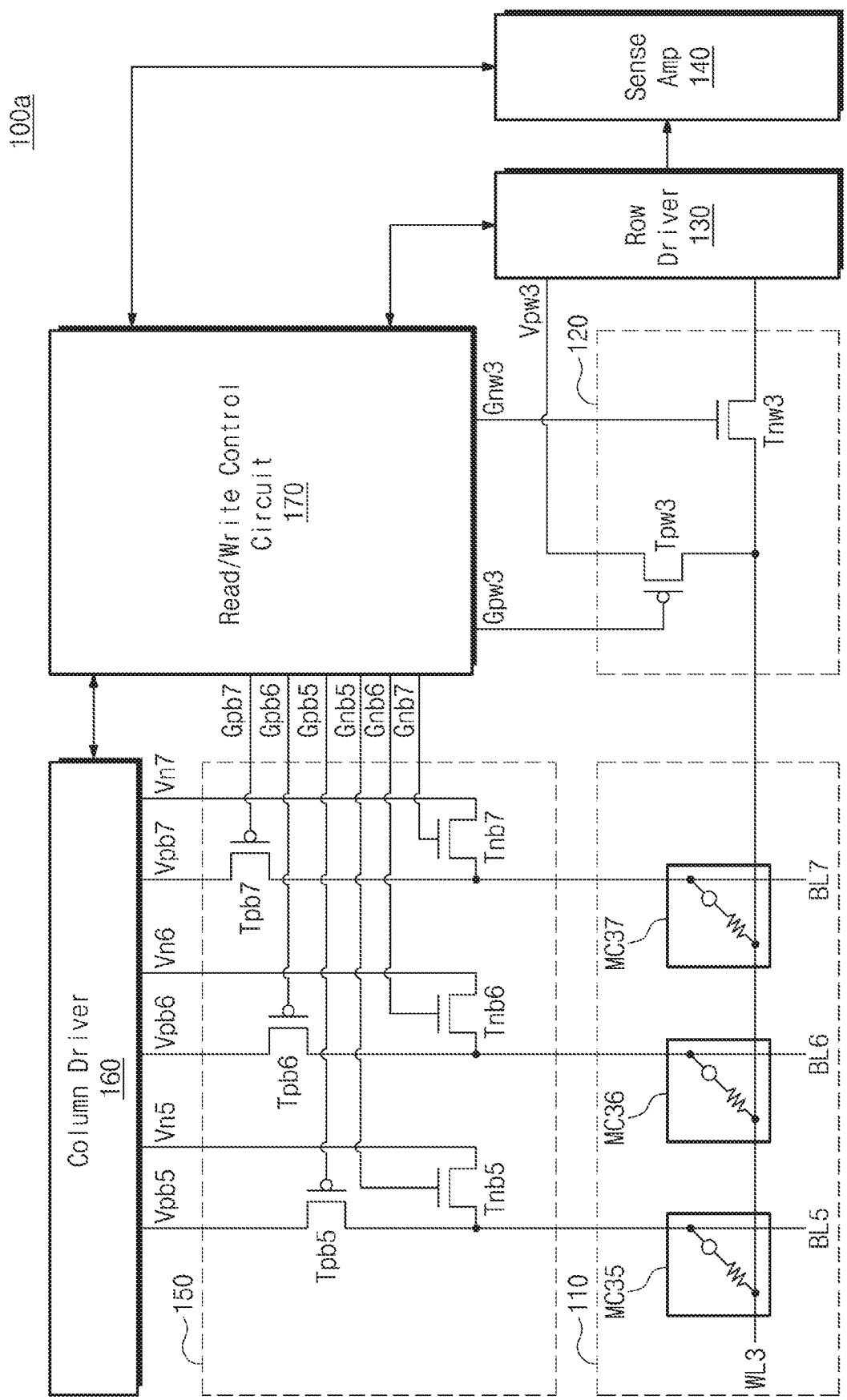
FIG. 4 is a circuit diagram illustrating a memory device of FIG. 1 in detail for the purpose of describing a read operation of a memory device according to an exemplary embodiment of the inventive concept.

FIG. 4 is a circuit diagram illustrating a memory device of FIG. 1 in detail for the purpose of describing a read operation of a memory device according to an exemplary embodiment of the inventive concept. A memory device 100a of FIG. 4 will be described with reference to the memory device 100 of FIG. 1 and the memory cell array 110a of FIG. 3. The memory cell array 110 includes the selected word line WL3, the selected bit line BL5, the unselected bit lines BL6 and BL7, the selected memory cell MC35, and the unselected memory cells MC36 and MC37. The row decoder 120 includes transistors Tpw3 and Tnw3. The column decoder 150 includes transistors Tpb5 to Tpb7 and Tnb5 to Tnb7. The transistors Tpb5 to Tpb7, Tnb5 to Tnb7, Tpw3, and Tnw3 may be used to precharge, bias, or float the word line WL3 or the bit lines BL5 to BL7. For example, the transistors Tnb5 to Tnb7, Tnw3 may be NMOS transistors, and the transistors Tpb5 to Tpb7 and Tpw3 may be PMOS transistors.

In the row decoder 120, first terminals (e.g., source terminals) of the transistors Tpw3 and Tnw3 are connected to the row driver 130. Second terminals (e.g., drain terminals) of the transistors Tpw3 and Tnw3 are connected to the word line WL3. Third terminals (e.g., gate terminals) of the transistors Tpw3 and Tnw3 are connected to the read/write control circuit 170.

In the column decoder 150, first terminals (e.g., source terminals) of the transistors Tpb5 to Tpb7 and Tnb5 to Tnb7 are connected to the column driver 160. Second terminals (e.g., drain terminals) of the transistors Tpb5 and Tnb5 are connected to the bit line BL5. Second terminals (e.g., drain terminals) of the transistors Tpb6 and Tnb6 are connected to the bit line BL6. Second terminals (e.g., drain terminals) of the transistors Tpb7 and Tnb7 are connected to the bit line BL7. Third terminals (e.g., gate terminals) of the transistors Tpb5 to Tpb7 and Tnb5 to Tnb7 are connected to the read/write control circuit 170.

The row driver 130 outputs a voltage Vpw3 to be applied to the first terminal (e.g., a source terminal) of the transistor Tpw3. The column driver 160 outputs voltages Vpb5 to Vpb7 and Vn5 to Vn7 to be applied to the first terminals (e.g., source terminals) of the transistors Tpb5 to Tpb7 and Tnb5 to Tnb7. In an exemplary embodiment, the voltages Vpw3, Vpb5 to Vpb7, and Vn5 to Vn7 are power supply voltages. The power supply voltages Vpw3, Vpb5 to Vpb7, and Vn5 to Vn7 may be generated by the row driver 130 or may be generated by any other component (e.g., a voltage generator 338 to be described with reference to FIG. 14). To control the precharging, biasing, or floating of the word line WL3, the read/write control circuit 170 may output voltages Gpw3 and Gnw3 to be applied to the third terminals (e.g., gate terminals) of the transistors Tpw3 and Tnw3 in the row decoder 120. To control the precharging, biasing, or floating of the bit lines BL5 to BL7, the read/write control circuit 170 may output voltages Gpb5 to Gpb7 and Gnb5 to Gnb7 to be applied to the third terminals (e.g., gate terminals) of the transistors Tpb5 to Tpb7 and Tnb5 to Tnb7 in the column decoder 150. The gate voltages Gpb5 to Gpb7, Gnb5 to Gnb7, Gpw3, and Gnw3 of the transistors Tpb5 to Tpb7, Tnb5 to Tnb7, Tpw3, and Tnw3 will be more fully described with reference to FIGS. 5A and 5B.

Figure 5A:
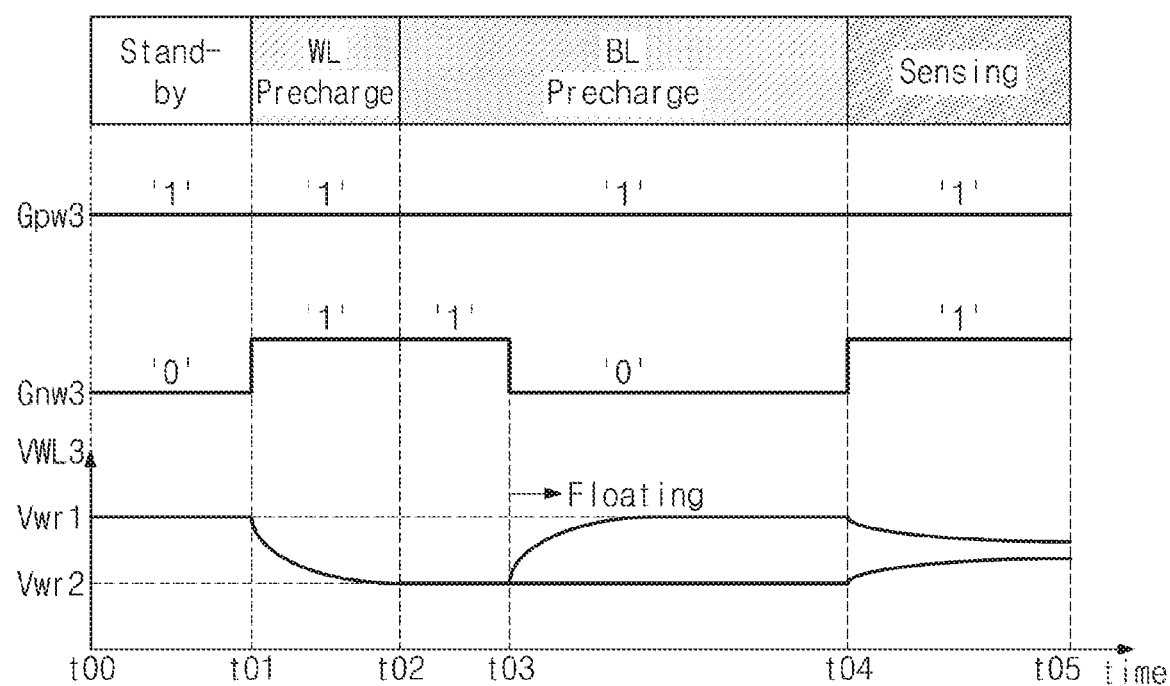
FIGS. 5A and 5B are graphs illustrating voltages that are applied to a word line, a bit line, and transistors in the circuit diagram of FIG. 4.
Figure 5B:
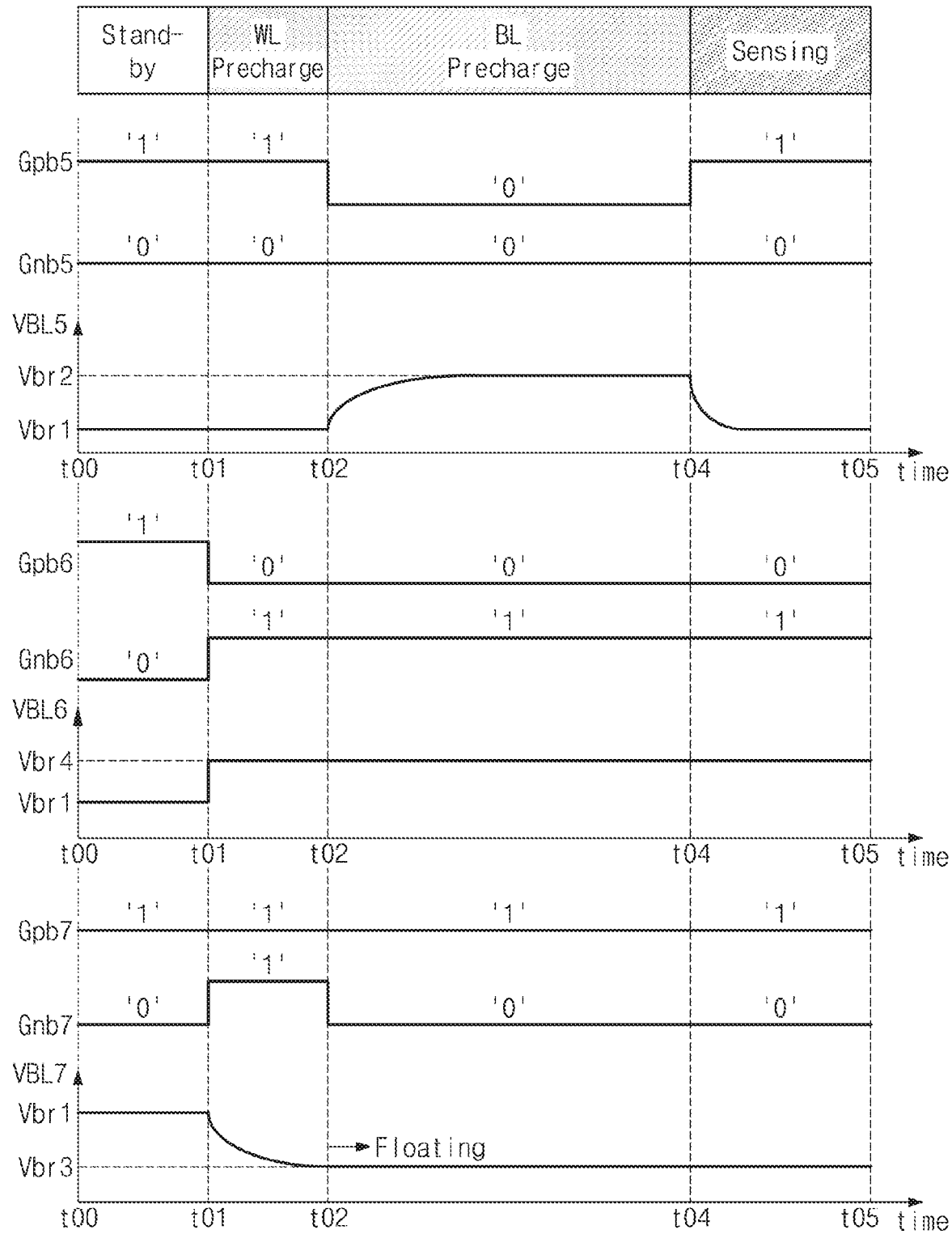

FIGS. 5A and 5B are graphs illustrating voltages that are applied to a word line, a bit line, and transistors in the circuit diagram of FIG. 4. The graphs of FIGS. 5A and 5B will be described based on time periods t00 to t01 (a standby phase), t01 to t02 (a selected word line precharge phase), t02 to t04 (a selected bit line precharge phase), and t04 to t05 (a sensing phase). In FIGS. 5A and 5B, a horizontal axis represents a time, and a vertical axis represents a voltage.

In the time period t00 to t01 (standby phase), the memory device 100a stands by for an access operation (e.g., a read operation). In the standby phase, the memory device 100a may wait for a read command from an external device (e.g., a host). In the standby phase, the voltages Gpb5 to Gpb7 and Gpw3 applied to the gates of the transistors Tpb5 to Tpb7 and Tpw3 have a level of logic high (or logic "1"), and the voltages Gnb5 to Gnb7 and Gnw3 applied to the gates of the transistors Tnb5 to Tnb7 and Tnw3 have a level of logic low (or logic "0"). A voltage VWL3 of the selected word line WL3 is a voltage level Vwr1. Voltages VBL5 to VBL7 of the bit lines BL5 to BL7 are a voltage level Vbr1. For example, the voltage levels Vbr1 and Vwr1 may be 0 V. In an exemplary embodiment, transistors Tpw3 and Tnw3 are turned off during the standby phase.

In the time period t01 to t02 (selected word line precharge phase), to precharge the selected word line WL3, the voltages Gpw3 and Gnw3 to be applied to the gates of the transistors Tpw3 and Tnw3 connected to the selected word line WL3 are a level of logic high (or logic "1"). The voltage VWL3 of the selected word line WL3 may vary from the voltage level Vwr1 to the voltage level Vwr2 (e.g., may decrease when Vwr1>Vwr2). Accordingly, the selected word line WL3 may be precharged to the voltage level Vwr2 at the time t02. For example, the selected word line WL3 may reach voltage level Vwr2 by the end of the precharge phase. In an exemplary embodiment, during the precharging of the selected word line WL3, the voltage VBL5 of the selected bit line BL5 and the voltages Gpb5 and Gnb5 to be applied to the gates of the transistors Tpb5 and Tnb5 connected to the selected bit line BL5 are identical to that in the standby phase. In an exemplary embodiment, transistor Tpw3 is turned off and Tnw3 is turned on during the selected word line precharge phase so the selected word line WL3 may receive a precharge voltage from the row driver 130.

In the time period t01 to t02 (selected word line precharge phase), the voltages
Gpb6 and Gnb6 to be applied to the gates of the transistors Tpb6 and Tpn6 connected to the unselected bit line BL6 adjacent to the selected bit line BL5 are levels of logic low (or logic "0") and logic high (or logic "1"), respectively, and the voltage VBL6 of the unselected bit line BL6 is the voltage level Vbr4. Here, the voltage level Vbr4 may be referred to as a "level of a biasing voltage". For example, the voltage level Vbr4 may be 0 V. In this case, the voltage level Vbr4 may be referred to as a "zero biasing voltage level". In an exemplary embodiment, the unselected bit line BL6 is biased from the time t01 to the voltage level Vbr4. However, the time t01 at which the biasing of the unselected bit line BL6 starts is only an example. Unlike FIG. 5B, the unselected bit line BL6 may maintain the standby phase in the time period t01 to t02 (selected word line precharge phase).

In the time period t01 to t02 (selected word line precharge phase), the voltages Gpb7 and Gnb7 to be applied to the gates of the transistors Tpb7 and Tpn7 connected to the unselected bit line BL7 not adjacent to the selected bit line BL5 are a level of logic high (or logic "1"), and the voltage VBL7 of the unselected bit line BL7 may vary from the voltage level Vbr1 to the voltage level Vbr3 (e.g., may decrease when Vbr1>Vbr3).

In the time period t02 to t04 (selected bit line precharge phase), to precharge the selected bit line BL5, voltages to be applied to the gates of the transistors Tpb5 and Tnb5 connected to the selected bit line BL5 are a level of logic low (or logic "0"). The voltage VBL5 of the selected bit line BL5 may vary from the voltage level Vbr1 to the voltage level Vbr2 (e.g., may increase when Vbr2>Vbr1). Accordingly, the selected bit line BL5 may be precharged to the voltage level Vbr2 at the time t04. The selected bit line BL5 may reach voltage Vbr2 during the selected bit line precharge phase before time t04. The voltage level Vbr2 may be referred to as a "level of a selection column voltage to be applied to the selected bit line BL5 to read data stored in the selected memory cell MC35". During at least a partial period t03 to t04 of the time period where the selected bit line BL5 is precharged, the voltage Gpw3 to be applied to the gate of the transistor Tpw3 is a level of logic high (or logic "1"), and the voltage Gnw3 to be applied to the gate of the transistor Tnw3 is a level of logic low (or logic "0"). Accordingly, during the at least a partial period t03 to t04 where the selected bit line BL5 is precharged, the selected word line WL3 that is at the voltage level Vwr2 is floated. For example, in the case where the time t03 is identical to the time t02, the selected word line WL3 that is at the voltage level Vwr2 may be floated during the time period t02 to t04 where the selected bit line BL5 is precharged. The voltage VWL3 of the selected word line WL3 during the time period t03 to t04 may be identical to voltages VWLon and VWLoff.ideal of the word line WL3 in a time period t22 to t26 of FIG. 9, which will be described later.

In the time period t02 to t04 (selected bit line precharge phase), the unselected bit line BL6 is biased to the voltage level Vbr4. Unlike what is illustrated in FIGS. 5A and 5B, the biasing of the unselected bit line BL6 may start at any time between the time t02 and the time t04. For example, the biasing of the unselected bit line BL6 may start at the time t03 between the time t02 and the time t04.

During the time period t02 to t04 (selected bit line precharge phase), the voltage Gpb7 to be applied to the gate of the transistor Tpb7 is a level of logic high (or logic "1"), and the voltage Gnb7 to be applied to the gate of the transistor Tnb7 is a level of logic low (or logic "0"). Accordingly, during the time period t02 to t04 where the selected bit line BL5 is precharged, the selected bit line BL7 that is at the voltage level Vbr3 and is not adjacent to the selected bit line BL5 is floated. Here, the voltage level Vbr3 may be referred to as a "level of a floating voltage". In an exemplary embodiment, transistors Tpb7 and Tnb7 are turned off during the selected bit line precharge phase to float the selected bit line BL5. However, the time t02 at which the floating of the unselected bit line BL7 starts is only an example. Unlike what is illustrated in FIGS. 5A and 5B, the floating of the unselected bit line BL7 may start at any time between the time t02 and the time t04. For example, the floating of the unselected bit line BL7 may start at the time t03 between the time t02 and the time t04.

In the time period t04 to t05 (sensing phase), the sense amplifier 140 senses a read voltage level of the selected word line WL3. The voltages Gpw3 and Gnw3 to be applied to the gates of the transistors Tpw3 and Tnw3 are a level of logic high (or logic "1"). Since the voltage Gnw3 is applied to the gate of the transistor Tnw3 at a logic high, the transistor Tnw3 is turned on, and the sense amplifier 140 is connected to the selected word line WL3 through the turned-on transistor Tnw3, which will be described with reference to FIG. 8. In the sensing phase, also, the selected word line WL3 that is floated at the voltage level Vwr2 may remain at a floating state. The voltage VWL3 of the selected word line WL3 in the time period t04 to t05 may be identical to the voltages VWLon and VWLoff.ideal of the word line WL3 in a time period t26 to t27 of FIG. 9, which will be described later. In an exemplary embodiment, transistor Tpw3 is turned off and transistor Tnw3 is turned on during the sensing phase.

During the time period t04 to t05 (sensing phase), the voltage Gpb5 to be applied to the gate of the transistor Tpb5 is a level of logic high (or logic "1"), and the voltage Gnb5 to be applied to the gate of the transistor Tnb5 is a level of logic low (or logic "0"). In the time period t04 to t05 (sensing phase), the selected bit line BL5 is floated. In an exemplary embodiment, transistors Tpb5 and Tnb5 are turned off during the sensing phase to float the selected bit line BL5. While the selected bit line BL5 is floated, the voltage VBL5 of the selected bit line BL5 may vary from the voltage level Vbr2 to the voltage level Vbr1 (e.g., may decrease when Vbr2>Vbr1). In the time period t04 to t05 (sensing phase), the unselected bit line BL6 adjacent to the selected bit line BL5 may remain at the biasing state where the unselected bit line BL6 is set to the voltage level Vbr4. The unselected bit line BL7 not adjacent to the selected bit line BL5 may remain at the floating state where the unselected bit line BL7 at the voltage level Vbr3 is floated. A time when the biasing of the bit line BL6 and the floating of the bit line BL7 complete and a time when the sensing phase completes may be the time t05. That is, the time when the biasing of the bit line BL6 and the floating of the bit line BL7 complete may be identical to the time when the sensing phase completes.

Figure 6:
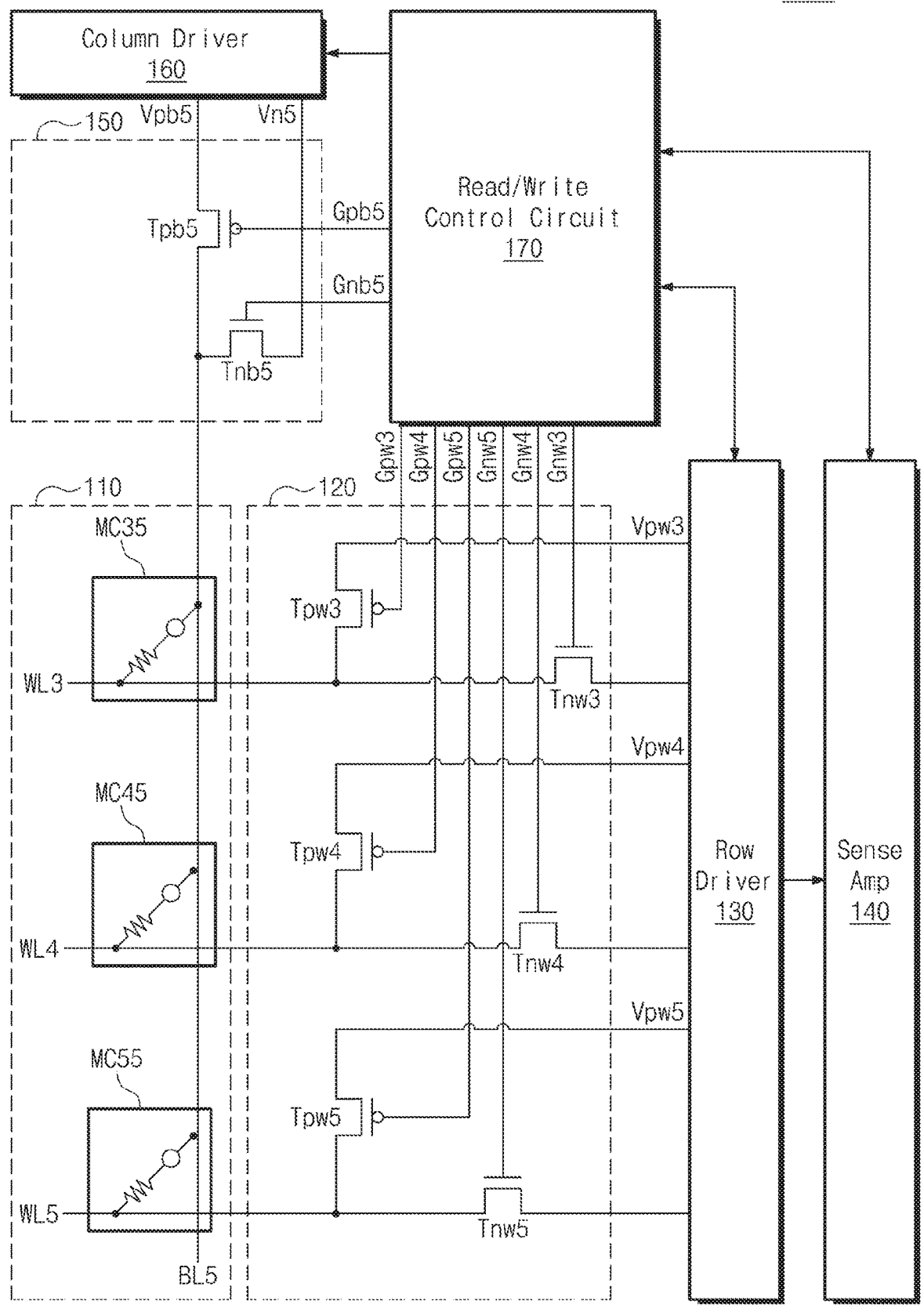
FIG. 6 is a circuit diagram illustrating a memory device of FIG. 1 in detail for the purpose of describing a write operation of a memory device according to an exemplary embodiment of the inventive concept.

FIG. 6 is a circuit diagram illustrating a memory device of FIG. 1 in detail for the purpose of describing a write operation of a memory device according to an exemplary embodiment of the inventive concept. A memory device 100b of FIG. 6 will be described with reference to the memory device 100 of FIG. 1 and the memory cell array 110a of FIG. 3. The memory cell array 110 includes the selected bit line BL5, the selected word line WL3, the unselected word lines WL4 and WL5, the selected memory cell MC35, and the unselected memory cells MC45 and MC55. The row decoder 120 includes transistors Tpw3 to Tpw5 and Tnw3 to Tnw5. The column decoder 150 includes transistors Tpb5 and Tnb5. The transistors Tpw3 to Tpw5, Tnw3 to Tnw5, Tpb5, and Tnb5 may be used to precharge, bias, or float the bit line BL5 or the word lines WL3 to WL5. For example, the transistors Tnw3 to Tnw5, Tnb5 may be NMOS transistors, and the transistors Tpw3 to Tpw5 and Tpb5 may be PMOS transistors.

In the row decoder 120, first terminals (e.g., source terminals) of the transistors Tpw3 to Tpw5 and Tnw3 to Tnw5 are connected to the row driver 130. Second terminals (e.g., drain terminals) of the transistors Tpw3 and Tnw3 are connected to the word line WL3. Second terminals (e.g., drain terminals) of the transistors Tpw4 and Tnw4 are connected to the word line WL4. Second terminals (e.g., drain terminals) of the transistors Tpw5 and Tnw5 are connected to the word line WL5. Third terminals (e.g., gate terminals) of the transistors Tpw3 to Tpw5 and Tnw3 to Tnw5 are connected to the read/write control circuit 170.

In the column decoder 150, first terminals (e.g., source terminals) of the transistors Tpb5 and Tnb5 are connected to the column driver 160. Second terminals (e.g., drain terminals) of the transistors Tpb5 and Tnb5 are connected to the bit line BL5. Third terminals (e.g., gate terminals) of the transistors Tpb5 and Tnb5 are connected to the read/write control circuit 170.

The row driver 130 outputs voltages Vpw3 to Vpw5 to be applied to the first terminals (e.g., source terminals) of the transistors Tpw3 to Tpw5. The column driver 160 outputs voltages Vpb5 and Vn5 to be applied to the first terminals (e.g., source terminals) of the transistors Tpb5 to Tnb5. In an exemplary embodiment, the voltages Vpb5, Vn5, and Vpw3 to Vpw5 are power supply voltages. The power supply voltages Vpb5, Vn5, and Vpw3 to Vpw5 may be generated by the row driver 130 or may be generated by another component (e.g., the voltage generator 338 to be described with reference to FIG. 14). To control the precharging, biasing, or floating of the bit line BL5, the read/write control circuit 170 may output voltages Gpb5 and Gnb5 to be applied to the third terminals (e.g., gate terminals) of the transistors Tpb5 and Tnb5 in the column decoder 150. To control the precharging, biasing, or floating of the word lines WL3 to WL5, the read/write control circuit 170 may output voltages Gpw3 to Gpw5 and Gnw3 to Gnw5 to be applied to the third terminals (e.g., gate terminals) of the transistors Tpw3 to Tpw5 and Tnw3 to Tnw5 in the row decoder 120. The gate voltages Gpw3 to Gpw5, Gnw3 to Gnw5, Gpb5, and Gnb5 of the transistors Tpw3 to Tpw5, Tnw3 to Tnw5, Tpb5, and Tnb5 will be more fully described with reference to FIGS. 7A and 7B. For example, word line WL4 that is adjacent to a selected word line WL3 may be biased to a non-selection row voltage Vpw4 by row decoder 130.

Figure 7A:
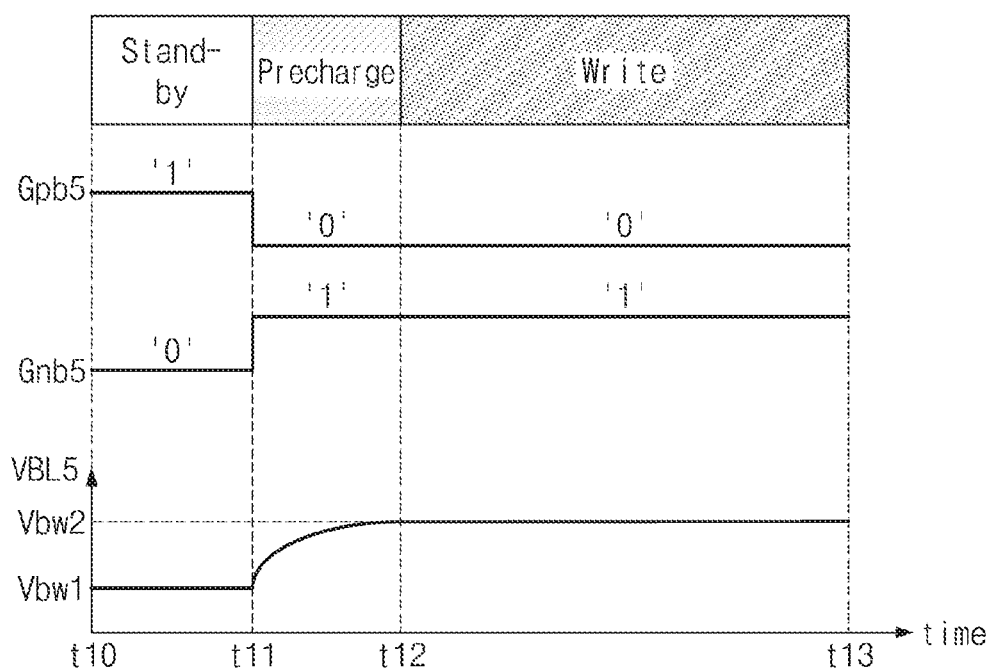
FIGS. 7A and 7B are graphs illustrating voltages that are applied to a word line, a bit line, and transistors in the circuit diagram of FIG. 6.
Figure 7B:
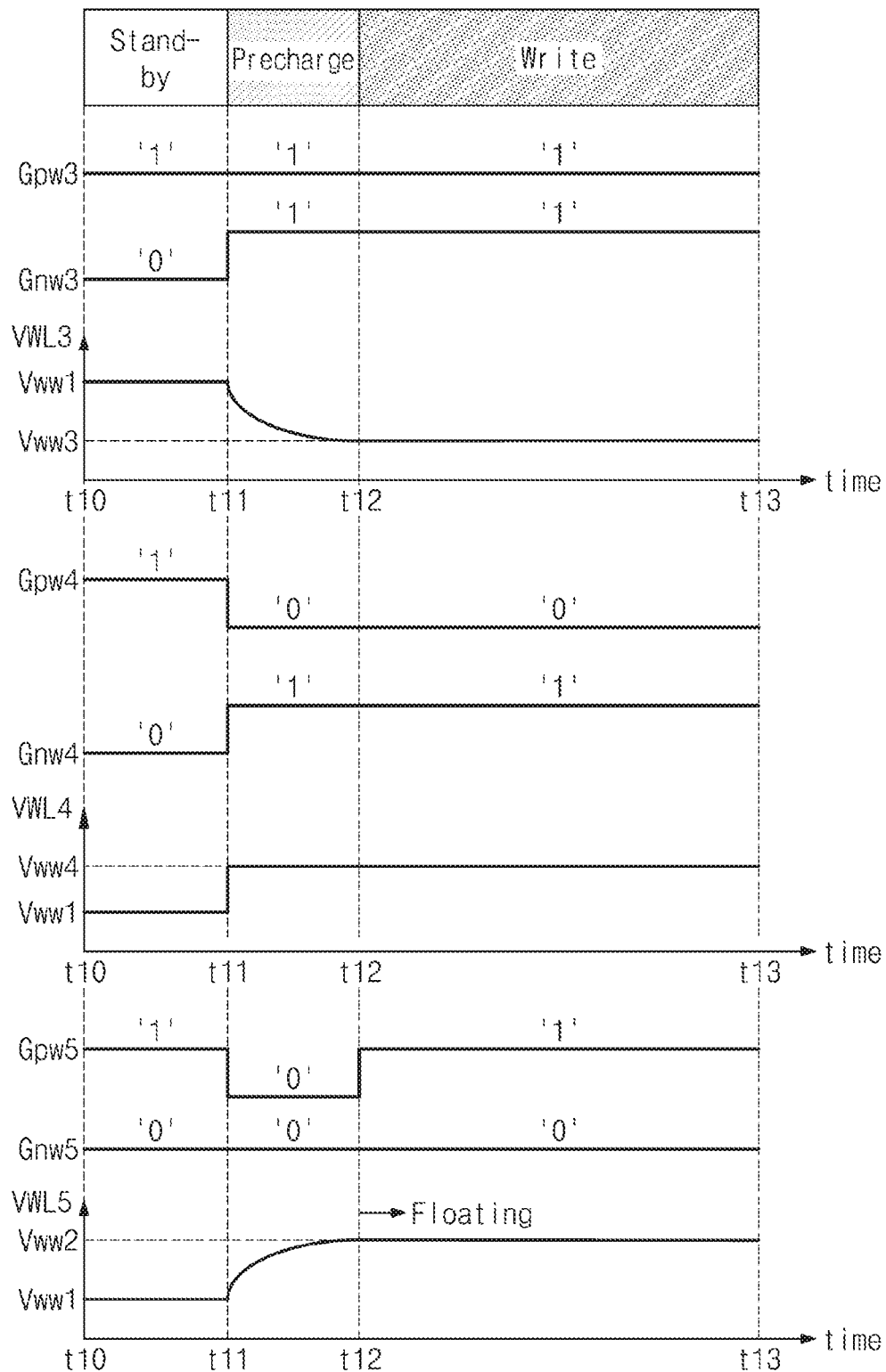

FIGS. 7A and 7B are graphs illustrating exemplary voltages that are applied to a word line, a bit line, and transistors in the circuit diagram of FIG. 6. The graphs of FIGS. 7A and 7B will be described based on time periods t10 to t11 (a standby phase), t11 to t12 (a precharge phase), and t12 to t13 (a write phase). In FIGS. 7A and 7B, a horizontal axis represents a time, and a vertical axis represents a voltage.

In the time period t10 to t11 (standby phase), the memory device 100b stands by for an access operation (e.g., a write operation). In the standby phase, the memory device 100b may wait for a write command from an external device (e.g., a host). In the standby phase, the voltages Gpw3 to Gpw5 and Gpb5 applied to the gates of the transistors Tpw3 to Tpw5 and Tpb5 are a level of logic high (or logic "1"), and the voltages Gnw3 to Gnw5 and Gnb5 applied to the gates of the transistors Tnw3 to Tnw5 and Tnb5 are a level of logic low (or logic "0"). A voltage VBL5 of the selected bit line BL5 is a voltage level Vbw1. Voltages VWL3 to VWL5 of the word lines WL3 to WL5 are a voltage level Vww1. For example, the voltage levels Vbw1 and Vww1 may be 0 V. In an exemplary embodiment, transistors Tpw3 to Tpw5 are turned off during the standby phase.

In the time period t11 to t12 (precharge phase), to precharge the selected bit line BL5, the voltage Gpb5 to be applied to the gate of the transistor Tpb5 connected to the selected bit line BL5 is a level of logic low (or logic "0") and the voltage Gnb5 to be applied to the gate of the transistor Tnb5 connected to the selected bit line BL5 is a level of logic high (or logic "1"). To precharge the selected word line WL3, the voltages Gpw3 and Gnw3 to be applied to the gates of the transistors Tpw3 and Tnw3 connected to the selected word line WL3 are a level of logic high (or logic "1"). The voltage VBL5 of the selected bit line BL5 may vary from the voltage level Vbw1 to the voltage level Vbw2 (e.g., may increase when Vbw2>Vbw1). Accordingly, the selected bit line BL5 is precharged to the voltage level Vbw2 at the time t12. For example, the selected bit line BL5 may reach voltage Vbw2 by the end of the precharge phase. The voltage VWL3 of the selected word line WL3 may vary from the voltage level Vww1 to the voltage level Vww3 (e.g., may decrease when Vww1>Vww3). Accordingly, the selected word line WL3 may be precharged to the voltage level Vww3 at the time t12. The voltage level Vww3 may be referred to as a "selection voltage to be applied to the selected word line WL3 to write data in the selected memory cell MC35". Referring to FIG. 7B, in an exemplary embodiment, during the write operation, the precharging of the selected bit line BL5 and the precharging of the selected word line WL3 are performed at the same time or during the same period.

In the time period t11 to t12 (precharge phase), the voltages Gpw4 and Gnw4 to be applied to the gates of the transistors Tpw4 and Tnw4 connected to the unselected word line WL4 adjacent to the selected word line WL3 are levels of logic low (or logic "0") and logic high (or logic "1"), respectively, and the voltage VWL4 of the unselected word line WL4 is the voltage level Vww4. Here, the voltage level Vww4 may be referred to as a "level of a biasing voltage". The level Vww4 of the biasing voltage of the unselected word line WL4 may be different from the level Vbr4 of the biasing voltage of the unselected bit line BL6 of FIG. 5B. For example, the voltage level Vww4 may be 0 V. In this case, the voltage level Vww4 may be referred to as a "zero biasing voltage level". While the selected bit line BL5 and the selected word line WL3 are precharged, the unselected word line WL4 may be biased from time t11 to the voltage level Vww4. However, the time t11 at which the biasing of the unselected word line WL4 starts is only an example. Unlike FIG. 7B, the unselected word line WL4 may maintain the standby phase in the time period t11 to t12 (precharge phase).

In the time period t11 to t12 (precharge phase), the voltages Gpw5 and Gnw5 to be applied to the gates of the transistors Tpw5 and Tnw5 connected to the unselected word line WL5 not adjacent to the selected word line WL3 are a level of logic low (or logic "0"), and the voltage VWL5 of the unselected word line WL5 may vary from the voltage level Vww1 to the voltage level Vww2 (e.g., may increase when Vww2>Vww1).

In the time period t12 to t13 (write phase), data is written in the selected memory cell MC35. For the write operation, the selected word line WL3 may maintain the voltage level Vww3, and the selected bit line BL5 may maintain the voltage level Vbw2. In the time period t12 to t13 (write phase), the unselected word line WL4 adjacent to the selected word line WL3 may remain at the biasing state where the unselected word line WL4 is set to the voltage level Vww4. Unlike that illustrated in FIGS. 7A and 7B, the biasing of the unselected word line WL4 may start at any time between the time t12 and the time t13.

During the time period t12 to t13 (write phase), the voltage Gpw5 to be applied to the gate of the transistor Tpw5 is a level of logic high (or logic "1"), and the voltage Gnw5 to be applied to the gate of the transistor Tnw5 is a level of logic low (or logic "0"). Accordingly, during the write phase, the unselected word line WL5 not adjacent to the selected word line WL3 is floated to the voltage level Vww2. In an exemplary embodiment, transistors Tpw5 and Tnw5 are turned off during the write phase to float the unselected word line WL5. For example, voltage level Vww2 may be referred to as a non-selection row voltage. Here, the voltage level Vww2 may be referred to as a "level of a floating voltage". However, the time t12 at which the floating of the unselected word line WL5 starts is only an example. Unlike that illustrated in FIGS. 7A and 7B, the floating of the unselected word line WL5 may start at any time between the time t12 and the time t13. A time when the biasing of the word line WL4 and the floating of the word line WL5 complete and a time when the write phase complete may be the time t13. That is, the time when the biasing of the word line WL4 and the floating of the word line WL5 completes may be identical to the time when the write phase completes.

Figure 8:
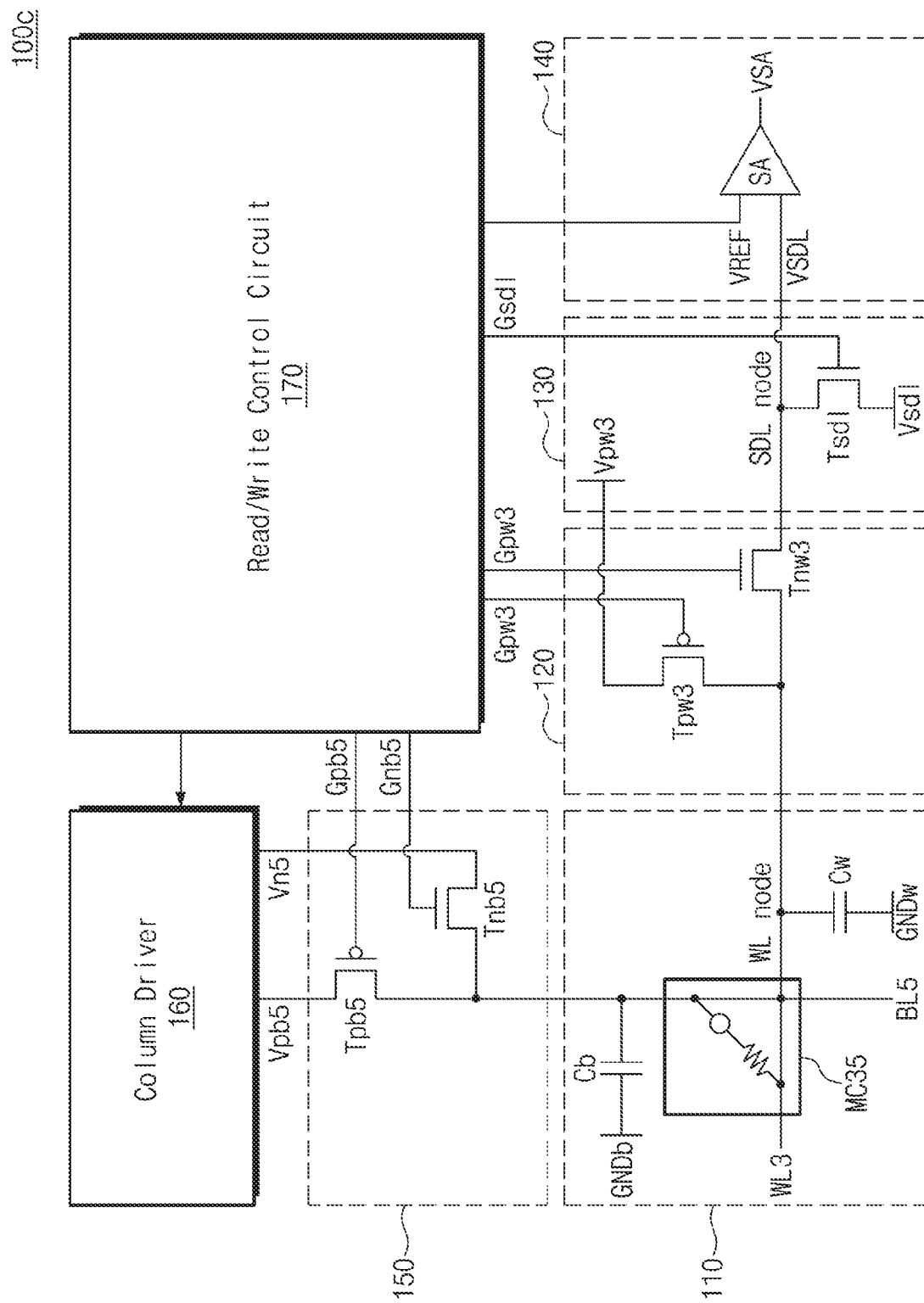
FIG. 8 is a circuit diagram illustrating a memory device of FIG. 1 in detail for the purpose of describing a read operation of a memory device according to an exemplary embodiment of the inventive concept.

FIG. 8 is a circuit diagram illustrating a memory device of FIG. 1 in detail for the purpose of describing a read operation of a memory device according to an exemplary embodiment of the inventive concept. The memory cell array 110 further includes a word line capacitor Cw and a bit line capacitor Cb. The row driver 130 includes a transistor Tsd1. A node providing the power supply voltage Vpw3 is connected to the first terminal (e.g., a source terminal) of the transistor Tpw3. The row driver 130 outputs power supply voltages Vpw3 and Vsd1. The power supply voltages Vpw3 and Vsd1 may be generated by the row driver 130 or may be generated by another component (e.g., the voltage generator 338 to be described with reference to FIG. 14).

The sense amplifier 140 includes a sense amplifier SA connected to the word line WL3. FIG. 8 is for describing an operation of sensing voltages of the selected word line WL3 and the selected bit line BL5 to read data stored in the selected memory cell MC35, and the unselected bit lines BL6 and BL7 and the transistors Tpb6, Tnb6, Tpb7, and Tnb7 are omitted for convenience of description. Components of FIG. 8 having the same reference numerals/marks as components included in the memory device 100 of FIG. 1 and the memory device 100a of FIG. 4 may be identical to the components of the memory devices 100 and 100a of FIGS. 1 and 4.

A first terminal of the word line capacitor Cw is connected to the word line WL3 (i.e., a word line node "WL node" on the word line WL3), and a second terminal of the word line capacitor Cw may be connected to GNDw which may be a ground terminal grounded by any other word line (e.g., WL4 or WL6 of FIG. 6) or the bit lines BL5 and BL6. A first terminal of the bit line capacitor Cb is connected to the bit line BL5, and a second terminal of the bit line capacitor Cb is connected to GNDb which may be a ground terminal grounded by any other bit line (e.g., BL6 or BL7 of FIG. 4) or the word lines WL3 to WL5. The word line capacitor Cw and the bit line capacitor Cb may be capacitors that are parasitic on word lines and bit lines in the memory cell array 110. For example, a capacitance value of the bit line capacitor Cb (e.g., a capacitance value of the bit line BL5) may be greater than a capacitance value of the word line capacitor Cw (e.g., a capacitance value of the word line WL3), but the inventive concept is not limited thereto.

A first terminal (e.g., an input terminal) of the sense amplifier SA is connected to the transistor Tnw3. The first terminal of the sense amplifier SA is connected to the transistor Tnw3 through a sensing data line SDL. The first terminal of the sense amplifier SA is connected to the word line WL3 through the transistor Tnw3 that is turned on and is turned off under control of the read/write control circuit 170. For example, the read/write control circuit 170 may turn on the transistor Tnw3 by applying the voltage Gnw3 at a level of logic high (or logic "1") to the gate of the transistor Tnw3. When the transistor Tnw3 is turned on, the word line WL3 is connected to the first terminal of the sense amplifier SA. When the word line WL3 is connected to the first terminal of the sense amplifier SA, the sense amplifier SA senses a read voltage level VSDL of the word line WL3. The voltage level VSDL may be identical to the voltage level VWL3 of FIG. 5A.

A second terminal of the sense amplifier SA is connected to the read/write control circuit 170. The read/write control circuit 170 provides a reference voltage level VREF to the second terminal of the sense amplifier SA. For example, the read/write control circuit 170 may provide the reference voltage level VREF generated by another component (e.g., the voltage generator 338 of FIG. 14) in a memory device 100c to the second terminal of the sense amplifier SA. The reference voltage level VREF may be a reference for identifying a state of the memory cell MC35, such as a state (e.g., set state) indicating a digital logical value of "1" or a state (e.g., a reset state) indicating a digital logical value of "0". For example, in the case where the memory cell MC35 has a state indicating a digital logical value of "1", the memory cell MC35 may be referred to as an "on cell"; and in the case where the memory cell MC35 has a state indicating a digital logical value of "0", the memory cell MC35 may be referred to as an "off cell". The sense amplifier SA may output a sensing result VSA by comparing the voltage level VSDL and the reference voltage level VREF. For example, the voltage level VSDL being lower than the reference voltage level VREF could indicate one of the two states and being higher than the reference voltage level VREF could indicate the other of the two states.

A first terminal (e.g., a drain terminal) of the transistor Tsd1 is connected to a node providing the power supply voltage Vsd1. A second terminal (e.g., a gate terminal) of the transistor Tsd1 is connected to the read/write control circuit 170. A third terminal (e.g., a source terminal) of the transistor Tsd1 is connected to a node "SDL node" on the sensing data line SDL.

Figure 9:
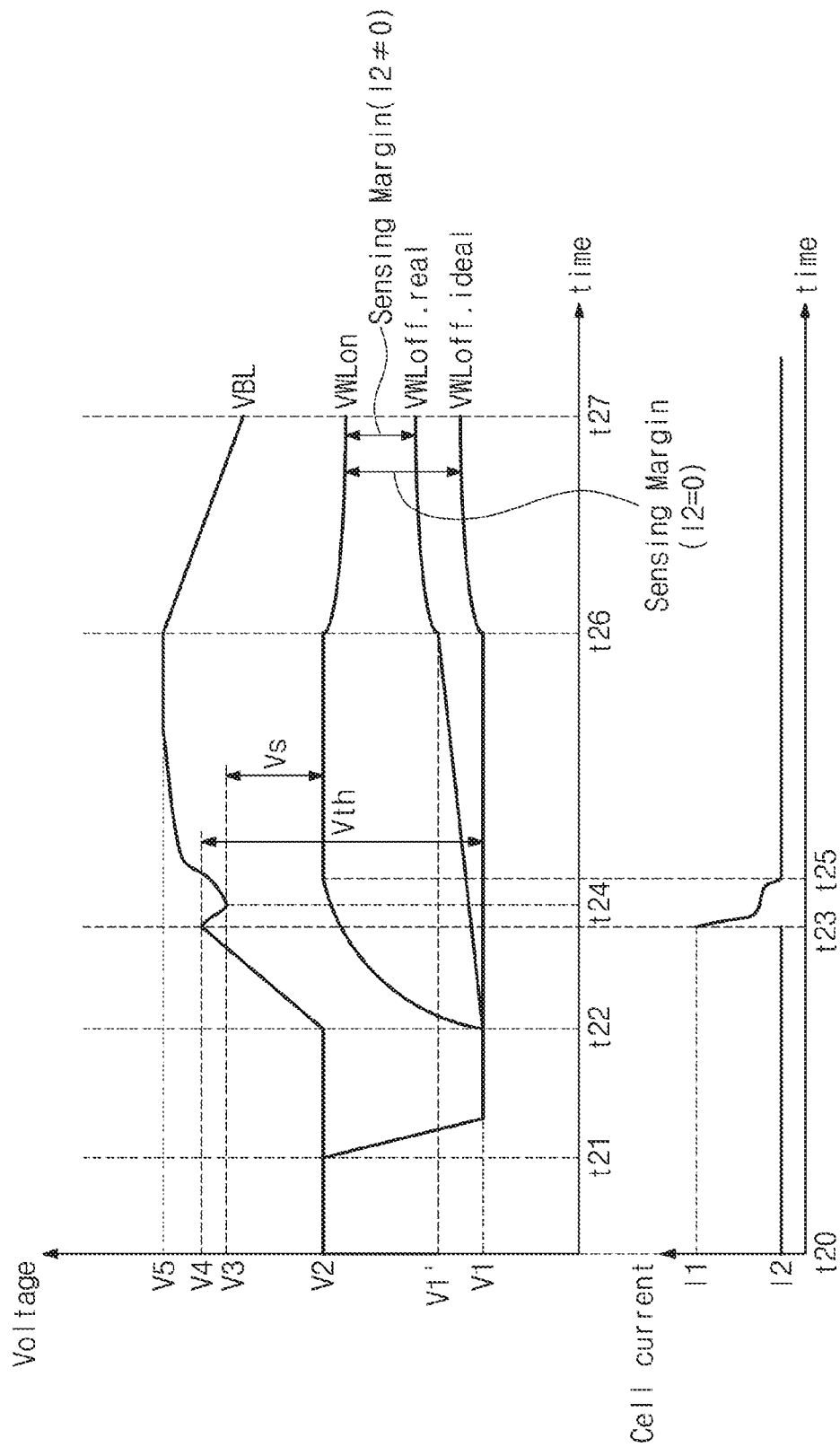
FIG. 9 illustrates graphs for describing voltages of a word line and a bit line and a current flowing into a memory cell connected to a word line and a bit line in the circuit diagram of FIG. 8.

FIG. 9 illustrates exemplary graphs for describing voltages of a word line and a bit line and a current flowing at a memory cell connected to a word line and a bit line in the circuit diagram of FIG. 8. FIG. 9 shows the voltage VWLoff.ideal of the selected word line WL3 when an off current does not flow (I2=0) and the voltage VWLoff.real of the selected word line WL3 when the off current flows (I2≠0), in the case where the selected memory cell MC35 is an off cell. The voltage VBL of the selected bit line BL5, a voltage VWLon of the selected word line WL3 when the selected memory cell MC35 is an on cell, a voltage VWLoff.real or VWLoff.ideal of the selected word line WL3 when the selected memory cell MC35 is an off cell, and a cell current crossing the selected memory cell MC35 will be described with respect to a time period t20 to t27. FIG. 9 will be described with reference to FIGS. 5A and 5B.

The time period t20 to t21 may correspond to the standby phase of FIGS. 5A and 5B. The voltage VBL of the selected bit line BL5 and the voltage VWLon, VWLoff.real, or VWLoff.ideal of the selected word line WL3 corresponds to a voltage level V2. For example, the voltage level V2 may be 0 V.

The time period t21 to t22 may correspond to the selected word line precharge phase of FIGS. 5A and 5B. The voltage VWLon, VWLoff.real, or VWLoff.ideal of the selected word line WL3 may vary from the voltage level V2 to the voltage level V1 (e.g., may decrease when V2>V1). Accordingly, the selected word line WL3 may be precharged to the voltage level V1 at the time t22. While the selected word line WL3 is precharged, the voltage VBL of the selected bit line BL5 may be identical to its voltage in the standby phase. For example, the voltage VBL of the selected bit line BL5 may be Vbr1.

The time period t22 to t26 corresponds to the selected bit line precharge phase of FIGS. 5A and 5B. The voltage VBL of the selected bit line BL5 may vary from the voltage level V2 to the voltage level V5 (e.g., may increase when V5>V2). When a difference between the voltage VBL of the bit line BL5 and the voltage VWLon, VWLoff.real, or VWLoff.ideal of the precharged word line WL3 reaches a threshold voltage Vth of the memory cell MC35 at the time t23, the memory cell MC35 is turned on, and a cell current crossing the memory cell MC35 may sharply vary from a current level I2 to a current level I1 (e.g., may increase when I1>I2). In the time period t23 to t24, the voltage VBL of the bit line BL5 may vary from a voltage level V4 to the voltage level V3 (e.g., may decrease when V4>V3) due to a sharp current change of the memory cell MC35 and then, a cell current crossing the memory cell MC35 may again vary from the current level I1 to the current level I2 (e.g., may decrease when I1>I2). When the voltage VBL of the bit line BL5 is the voltage level V3, a difference between a voltage of the bit line BL5 and the voltage VWLon of the word line WL3 may be a switching voltage Vs of the memory cell MC35. Afterwards, the voltage VBL of the bit line BL5 may vary from the voltage level V3 to the voltage level V5 (e.g., may increase when V5>V3). Afterwards, the selected bit line BL5 may be precharged to the voltage level V5 at the time t26.

In the time period t22 to t26 (selected bit line precharge phase), the selected word line WL3 is floated. For example, the selected word line WL3 may be floated in at least a partial period of the time period t22 to t26. In the case where the memory cell MC35 is an on cell, the voltage VWLon of the selected word line WL3 may vary from the voltage level V1 to the voltage level V2 (e.g., may increase when V2>V1). The voltage VWLon of the selected word line WL3 may be the voltage level V2.

In the time period t22 to t26 (selected word line precharge phase), when the memory cell MC35 is an off cell and an off current does not occur (I2=0), the voltage VWLoff.ideal of the selected word line WL3 maintains the voltage level V1. When the memory cell MC35 is an off cell and an off current occurs (I2≠0), the voltage VWLoff.real of the selected word line WL3 may vary from the voltage level V1 to the voltage level V1' (e.g., may increase when V1'>V1).

The time period t26 to t27 may correspond to the sensing phase of FIGS. 5A and 5B. In the time period t26 to t27 (sensing phase), the read/write control circuit 170 turns on the transistor Tnw3, and the word line WL3 is connected to the first terminal of the sense amplifier SA since the transistor Tnw3 is turned on. When the word line WL3 is connected to the first terminal of the sense amplifier SA, the sense amplifier SA senses the read voltage level VSDL of the word line WL3. In the sensing phase, the selected word line WL3 may remain at a floating state at the voltage level Vwr2. In the time period t26 to t27 (sensing phase), the selected bit line BL5 is floated. The voltage VBL of the selected bit line BL5 may decrease during the floating. For example, floating of the bit line BL5 may begin at time t26.

In the time period t26 to t27 (sensing phase), a sensing margin when an off current does not occur (I2=0) is greater than a sensing margin when an off current occurs (I2≠0). As the sensing margin increases, reliability necessary to read data stored in the memory cell MC35 may increase. In the read operation, according to an exemplary embodiment of the inventive concept, it may be possible to increase (or improve) the sensing margin by biasing unselected bit lines (e.g., BL4 and BL6 of FIG. 3) adjacent to the selected bit line BL5 and floating unselected bit lines (e.g., BL3 and BL7 of FIG. 3) not adjacent to the selected bit line BL5.

Figure 10:
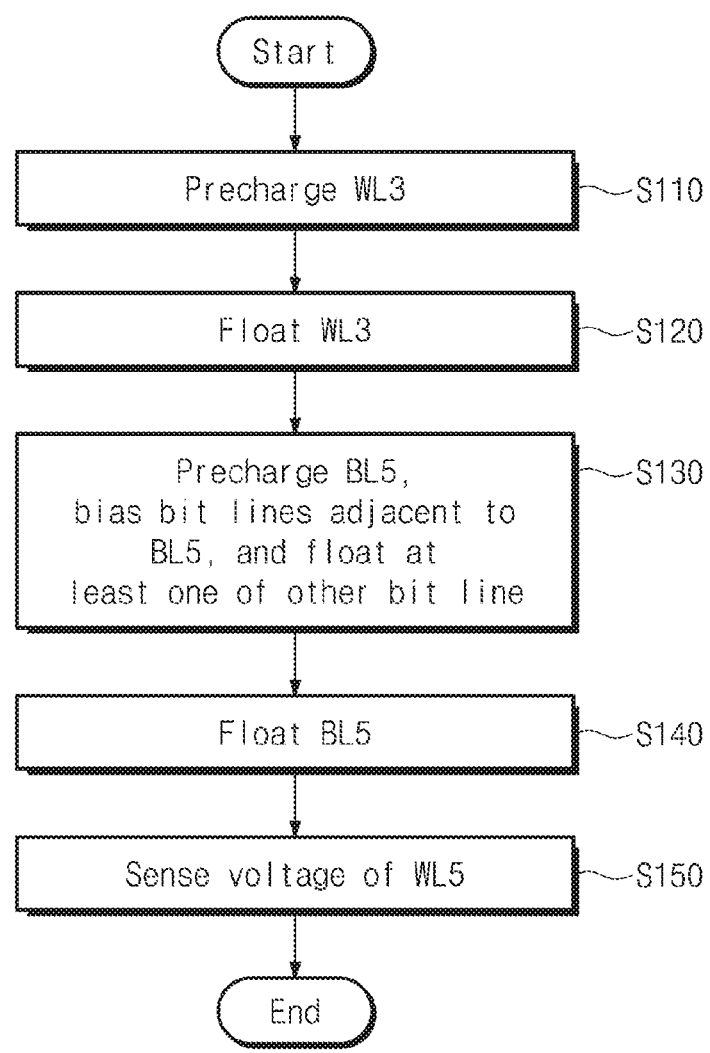
FIG. 10 is a flowchart illustrating a method of a read operation of a memory device according to an exemplary embodiment of the inventive concept.

FIG. 10 is a flowchart illustrating a method of a read operation of a memory device according to an exemplary embodiment of the inventive concept. FIG. 10 will be described with reference to the memory device 100c FIG. 8 and the graphs of FIG. 9.

In operation S110, the selected word line WL3 is precharged to the voltage level V1. In operation S120, the row decoder 120 floats the selected word line WL3. To float the selected word line WL3, the read/write control circuit 170 may control gate voltages of the transistors Tpw3 and Tnw3 connected to the selected word line WL3 (described with reference to FIG. 5A). For example, the selected word line WL3 could be floated by turning off transistors Tpw3 and Tnw3.

In operation S130, the selected bit line BL5 is precharged to the voltage level V5 by the column decoder 150. As the selected bit line BL5 is precharged, the word line capacitor Cw connected to the selected word line WL3 may be charged. In operation S130, the column decoder 150 biases a bit line (e.g., BL6 of FIG. 4) adjacent to the selected bit line BL5 so as to be set to a first voltage level (e.g., Vbr4 of FIG. 5B) and floats a bit line (e.g., BL7 of FIG. 4) not adjacent to the selected bit line BL5 to a second voltage level (e.g., Vbr3 of FIG. 5B). For the biasing of the bit line (e.g., BL6 of FIG. 4) adjacent to the selected bit line BL5 and the floating of the bit line (e.g., BL7 of FIG. 4) not adjacent to the selected bit line BL5, the read/write control circuit 170 may control gate voltages of transistors (e.g., Tpb6 and Tnb6) connected to the bit line (e.g., BL6 of FIG. 4) adjacent to the selected bit line BL5 and gate voltages of transistors (e.g., Tpb7 and Tnb7) connected to the bit line (e.g., BL7 of FIG. 4) not adjacent to the selected bit line BL5. A time to bias a bit line (e.g., BL6 of FIG. 5) to the first voltage level (e.g., Vbr4 of FIG. 5B) and a start time to float a bit line (e.g., BL7 of FIG. 4) not adjacent to the selected bit line BL5 to the second voltage level (e.g., Vbr3 of FIG. 5B) may be identical to a start time to precharge the selected bit line BL5 to the voltage level V5.

In operation S140, the column decoder 150 floats the selected bit line BL5. To float the selected bit line BL5, the read/write control circuit 170 may control gate voltages of the transistors Tpb5 and Tnb5 connected to the selected bit line BL5 (described with reference to FIG. 5B). For example, the read/write control circuit 170 may apply gate voltages to turn off transistors Tpb5 and Tnb5 to float the selected bit line BL5.

In operation S150, the sense amplifier SA senses the voltage level VSDL of the selected word line WL3. At the same the column decoder 150 floats the selected bit line BL5 or after the selected bit line BL5 is floated, the sense amplifier SA may sense a voltage generated by charges that are transferred from the word line node "WL node" on the word line WL3 to the node "SDL node" on the sensing data line SDL by the charge sharing and are charged at the word line capacitor Cw. The biasing of the bit line (e.g., BL6 of FIG. 4) adjacent to the selected bit line and the floating of the bit line (e.g., BL7 of FIG. 4) not adjacent to the selected bit line BL5 may both complete at a time when operation S150 completes.

Figure 11:
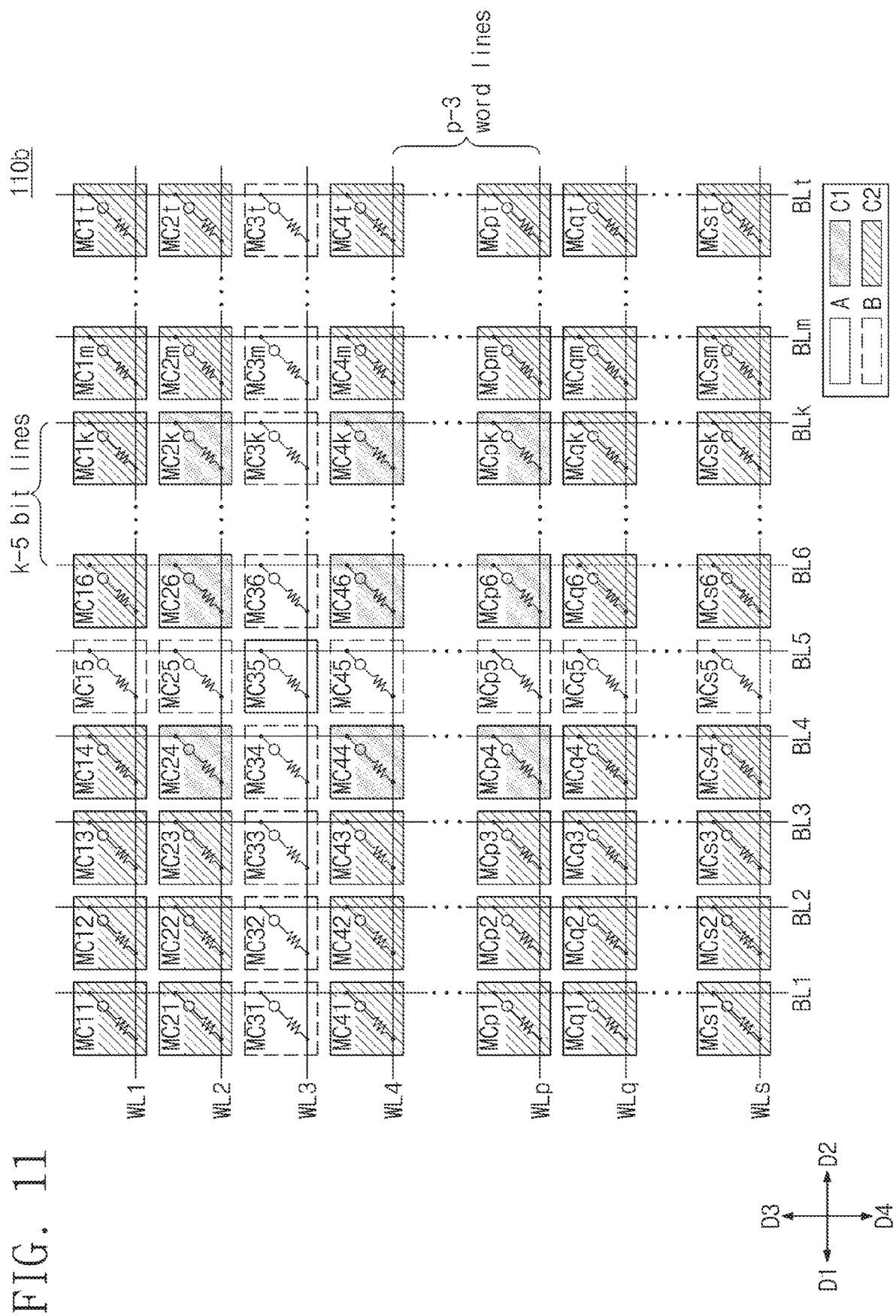
FIG. 11 is a block diagram illustrating another example of a memory cell array included in a memory device of FIG. 1.

FIG. 11 is a block diagram illustrating another example of a memory cell array included in a memory device of FIG. 1. FIG. 11 will be described with reference to FIGS. 1 and 3. A memory cell array 110b may be substantially identical to the memory cell array 110a of FIG. 3 except that the memory cell array 110b is different from the memory cell array 110a in the number of biased word lines and the number of biased bit lines. That is, in the read operation or the write operation of the memory device 100, compared to the memory device 100a, the row decoder 120 further biases word lines WL5 to WLp (p being an integer of more than 5) so as to be set to levels of voltages output from the row driver 130. In the read operation or the write operation of the memory device 100, compared to the memory device 100a, the column decoder 150 further biases bit lines BL7 to BLk (k being an integer of more than 7) so as to be set to levels of voltages output from the column driver 160. Accordingly, referring to FIGS. 3 and 11, in the read operation or the write operation of the memory device 100, the row decoder 120 may bias at least two word lines WL4 to WLp, and the column decoder 150 may bias at least two bit lines BL6 to BLk. The at least two word lines WL4 to WLp may be biased in order at different times, and the at least two bit lines BL6 to BLk may be biased in order at different times. In FIG. 11, the row decoder 120 may float word lines WL1 and WLq to WLs (q=p+1) at levels of different voltages output from the row driver 130, and the column decoder 150 may float bit lines BL1 to BL3 and BLm to BLt (m=k+1) at levels of different voltages output from the column driver 160. The word lines WL1 and WLq to WLs may be floated in order at different times, and the bit lines BL1 to BL3 and BLm to BLt may be floated in order at different times. The row decoder 120 may apply voltages of different levels to the biased word lines WL2 and WL4 to WLp and the floated word lines WL1 and WLq to WLs. The column decoder 150 may apply voltages of different levels to the biased bit lines BL5 and BL6 to BLk and the floated word lines BL1 to BL3 and BLm to BLt.

In FIG. 11, the word lines WL5 to WLp additionally biased compared to the memory cell array 110a of FIG. 3 may be adjacent to the selected word line WL3 in direction D4, and the bit lines BL7 to BLk additionally biased compared to the memory cell array 110a of FIG. 3 may be adjacent to the selected bit line BL5 in direction D2. However, additionally biased word lines and additionally biased bit lines are not limited to the example illustrated in FIG. 11. For example, additionally biased word lines may be adjacent to the selected word line WL3 in direction D3, and additionally biased bit lines may be adjacent to the selected bit line BL5 in direction D1.

Figure 12:
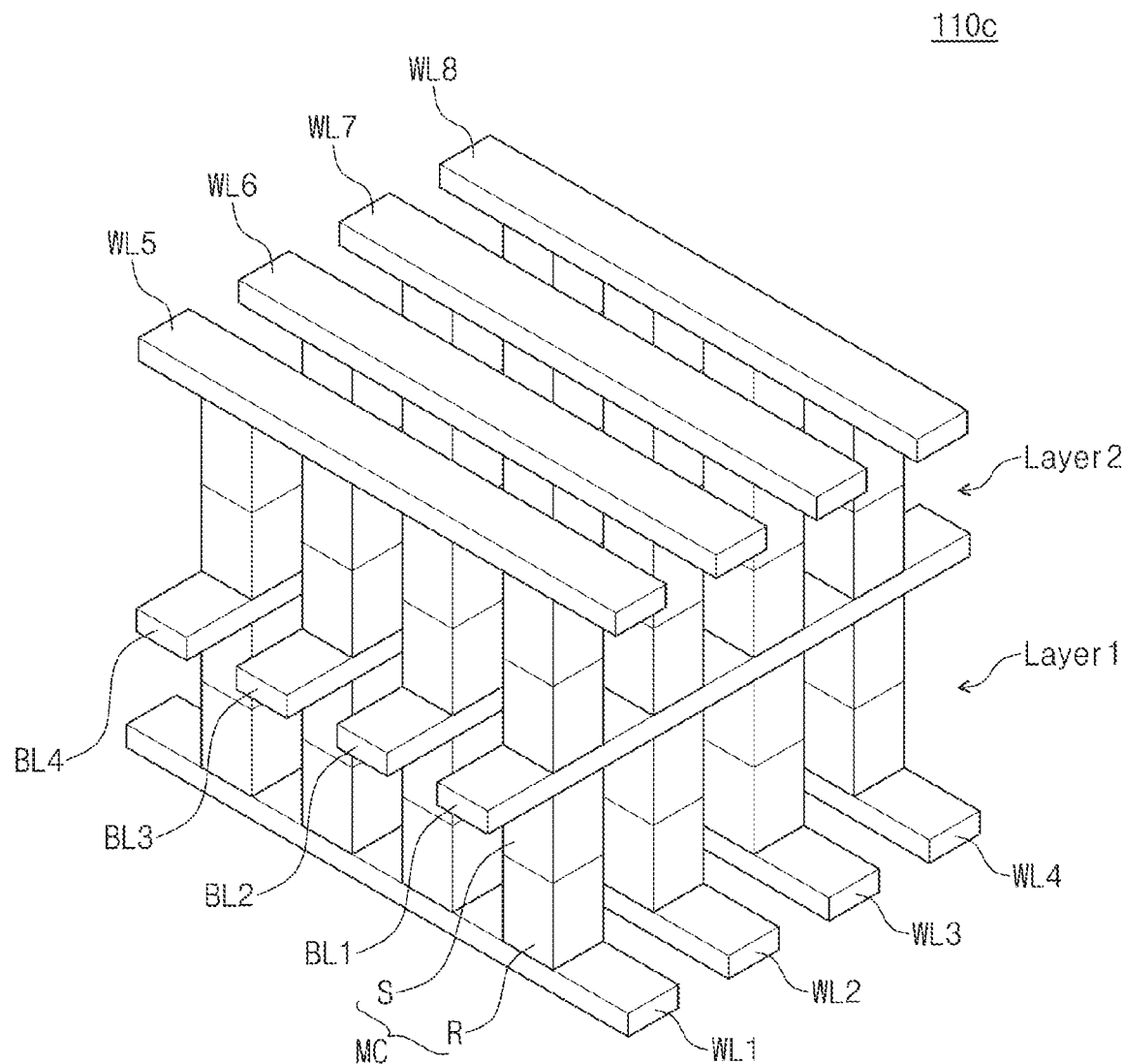
FIG. 12 illustrates an example of a structure of a memory cell array according to an exemplary embodiment of the inventive concept.

FIG. 12 illustrates an example of a structure of a memory cell array according to an exemplary embodiment of the inventive concept. Referring to FIG. 12, a memory device 110c includes a plurality of memory cells MC. Each of the memory cells MC may include the selection element "S" and the resistance element "R" as described with reference to FIG. 2. The memory cell MC may be interposed between a word line extending in a first direction and a bit line extending in a second direction perpendicular to the first direction. In this case, the selection element "S" and the resistance element "R" may be arranged in a third direction. For example, the resistance element "R" may be connected between a first word line WL1 and the selection element "S", and the selection element "S" may be connected between the resistance element "R" and a first bit line BL1.

The plurality of memory cells MC may be disposed in a first layer or may be disposed in a second layer. In this case, memory cells MC of the second layer may be stacked in the third direction with respect to memory cells MC of the first layer. As illustrated in FIG. 12, the memory cells MC of the first layer may be connected between first to fourth word lines WL1 to WL4 and first to fourth bit lines BL1 to BL4, and the memory cells MC of the second layer may be connected between fifth to eighth word lines WL5 to WL8 and the first to fourth bit lines BL1 to BL4. In this case, the first to fourth bit lines BL1 to BL4 may be connected to both the memory cells MC of the first layer and the memory cells MC of the second layer. However, the inventive concept is not limited thereto. For example, bit lines may be separately provided for each layer.

According to the stacked structure, at least one parasitic capacitor may be present in a space between the first to fourth word lines WL1 to WL4 and the first to fourth bit lines BL1 to BL4 or in a space between the first to fourth bit lines BL1 to BL4 and the fifth to eighth word lines WL5 to WL8 (e.g., the word line capacitor Cw or the bit line capacitor Cb of FIG. 8). The capacitor that is parasitic between stacked lines may be charged while a voltage (e.g., a selection voltage, a precharge voltage, a floating voltage, or a biasing voltage) is applied to the word lines WL1 to WL8 or the bit lines BL1 to BL4.

As described with reference to FIGS. 1 to 11, the memory device 100c may bias or float unselected word lines or unselected bit lines. FIG. 12 shows an example of the structure of the memory device 110c in which word lines and bit lines are disposed to cross each other, and the number of word lines, the number of bit lines, and the number of layers may be variously changed or modified.

Figure 13:
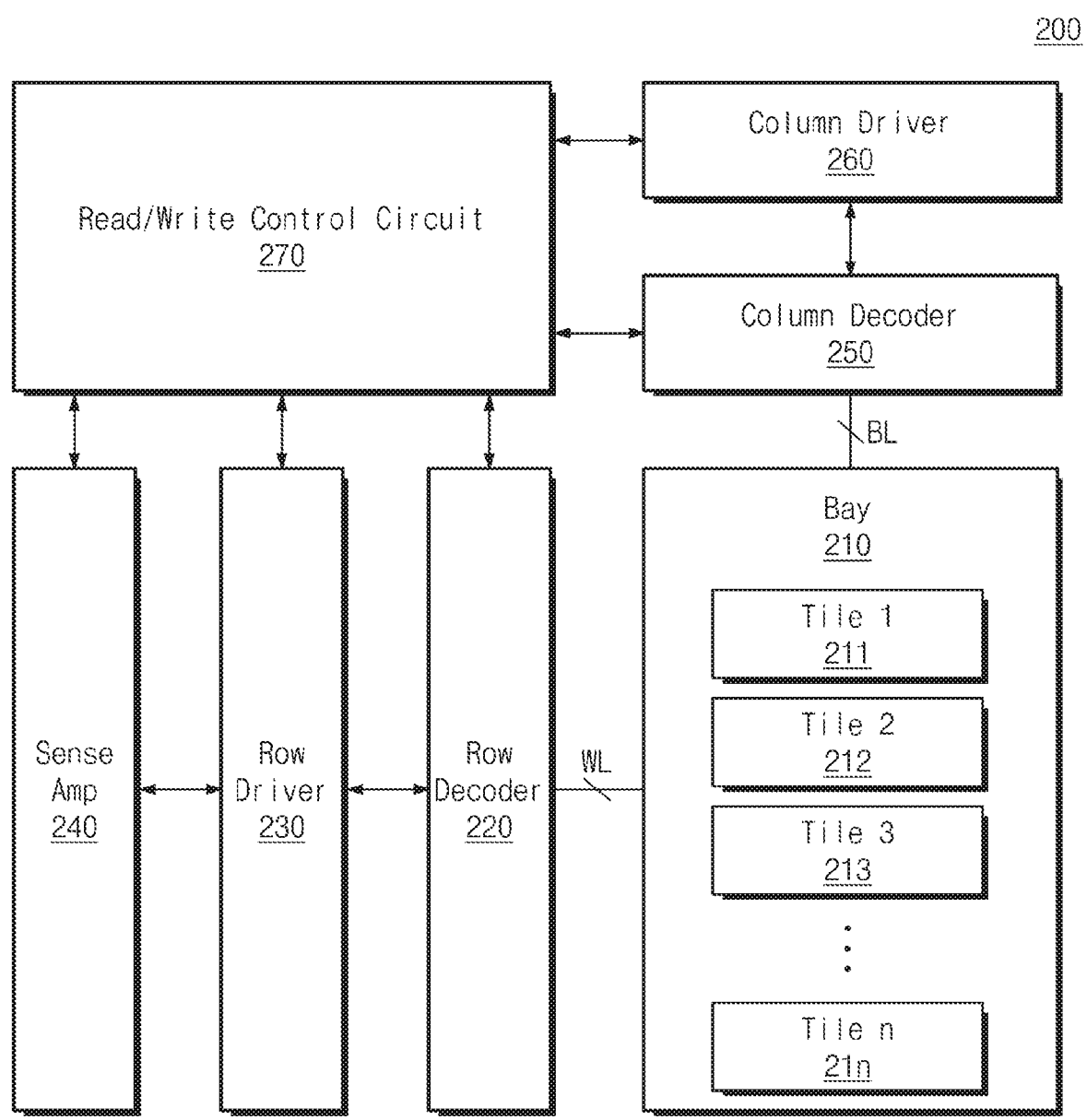
FIG. 13 is a block diagram illustrating a memory device according to an exemplary embodiment of the inventive concept.

FIG. 13 is a block diagram illustrating a memory device according to an exemplary embodiment of the inventive concept. FIG. 13 will be described with reference to FIG. 1. A memory device 200 may include a bay 210, a row decoder 220, a row driver 230, a sense amplifier 240, a column decoder 250, a column driver 260, and a read/write control circuit 270. The row decoder 220, the row driver 230, the sense amplifier 240, the column decoder 250, the column driver 260, and the read/write control circuit 270 may be substantially identical to the components 120 to 170 of FIG. 1, respectively.

The bay 210 may include at least two or more tiles 211 to 21n (e.g., 211, 212, and 213). The at least two or more tiles 211 to 21n include a plurality of word lines, a plurality of bit lines, and a plurality of memory cells connected between the plurality of word lines and the plurality of bit lines. For example, the number of word lines connected to the memory cells in each of the at least two or more tiles 211 to 21n may be more than or equal to the number of bit lines connected to the memory cells of each of the at least two or more tiles 211 to 21n. In detail, in each of the one or more tiles 211 to 21n, the number of word lines connected to memory cells may be 4K (=$2^{12}$) or more (or may exceed 4K), and the number of bit lines connected to memory cells may be 2K (=$2^{11}$) or more (or may exceed 2K). However, the inventive concept is not limited to the above numerical values. The bay 210 may be implemented to be different from the memory cell array 110 of FIG. 1. That is, a difference may exist between the memory cell array 110 of FIG. 1 and the bay 210 in the principle of implementing memory cells.

The row decoder 220, the row driver 230, and the sense amplifier 240 may be connected to the at least two or more tiles 211 to 21n. Each of the row decoder 220, the row driver 230, and the sense amplifier 240 may include components corresponding to each of the at least two or more tiles 211 to 21n. The components of the row decoder 220, which correspond to each of the at least two or more tiles 211 to 21n, may perform floating and biasing of a word line, independently. The components of the row driver 230, which correspond to each of the at least two or more tiles 211 to 21n, may output a precharge voltage, a selection voltage, a floating voltage, and a biasing voltage to word lines, independently. The components of the sense amplifier 240, which correspond to each of the at least two or more tiles 211 to 21n, may sense read voltage levels of the word lines, independently. The components of the column decoder 250, which correspond to each of the at least two or more tiles 211 to 21n, may perform floating and biasing of a bit line, independently. The components of the column driver 260, which correspond to each of the at least two or more tiles 211 to 21n, may output a precharge voltage, a selection voltage, a floating voltage, and a biasing voltage to bit lines, independently.

The read/write control circuit 270 may allow the row decoder 220 to bias or float word lines in the first tile 211 and may allow the column decoder 250 to bias or float bit lines in the first tile 211. In the at least two or more tiles 211 to 21n, the number of floating word lines, the number of biasing word lines, the number of floating bit lines, and the number of biasing bit lines may be differently set by the read/write control circuit 270. Also, in the at least two or more tiles 211 to 21n, floating voltages and biasing voltages of word lines and bit lines may be differently set by the read/write control circuit 270.

Figure 14:
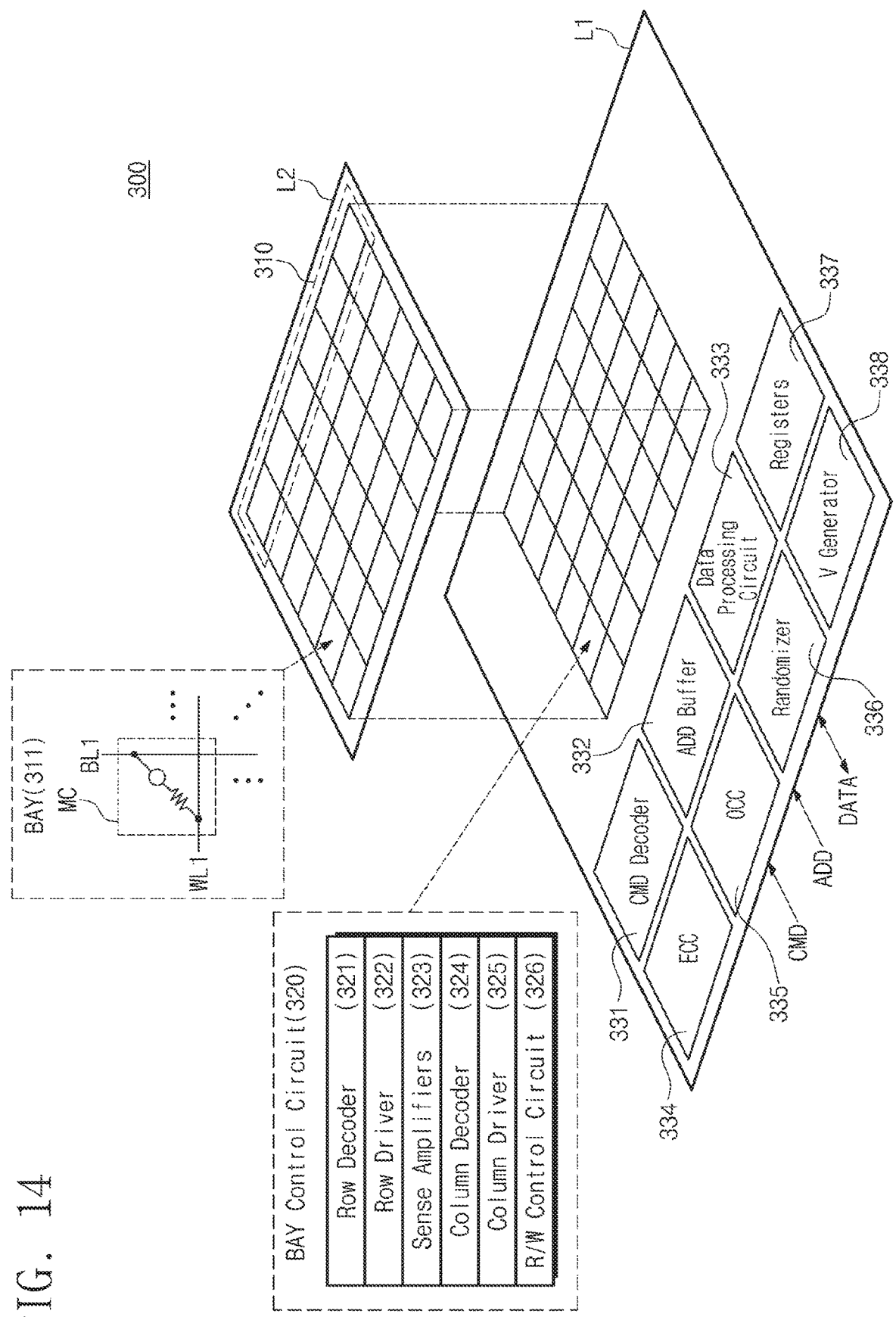
FIG. 14 is a block diagram illustrating a memory device according to an exemplary embodiment of the inventive concept.

FIG. 14 illustrates a block diagram of a memory device according to an exemplary embodiment of the inventive concept. A memory device 300 includes a layer L1 and a layer L2 located, disposed, or stacked on the layer L1. A vertical relationship of the layers L1 and L2 may be interchanged. The memory cells MC described with reference to FIGS. 1 to 13 may be arranged in the layer L2. The memory cells MC arranged in the layer L2 may constitute a bank 310. The bank 310 may include a plurality of bays 311. The bay 311 may include the memory cell MC connected to the word line WL and the bit line BL. The number of memory cells MC, the number of bays 311, and the number of banks 310 are only an example.

Bay control circuits 320 may be disposed in the layer L1. The bay control circuits 320 may control the bays 311 disposed in the layer L2, respectively. For example, in a plan view, the bay control circuit 320 and the bay 311 controlled by the bay control circuit 320 may overlap each other. The bay control circuit 320 may include a row decoder 321, a row driver 322, sense amplifiers 323, a column decoder 324, a column driver 325, and a read/write control circuit 326. The components 321 to 326 of the bay control circuit 320 may be substantially identical to the respective components 220 to 270 of the memory device 200 of FIG. 13.

The memory device 300 may include a command decoder 331 (e.g., a decoder circuit), an address buffer 332, a data processing circuit 333, an error correction circuit (ECC) 334, an on cell counter (OCC) 335, a randomizer 336 (e.g., randomizing circuit), registers 337, and a voltage generator 338. The components 331 to 338 may be included in a peripheral circuit of the memory device 300, and the peripheral circuit may be disposed in the layer L1. A structure where the memory cells MC are disposed in the layer L2 and circuits 320 and 331 to 338 for controlling the memory cells MC are disposed in the layer L1 may be referred to as a "cell on peri (COP)".

The command decoder 331 may receive a command CMD from the outside (e.g., a host or a memory controller) of the memory device 300. The command decoder 331 may decode the command CMD and may control the remaining components 311, 320, and 332 to 338 of the memory device 300 based on the decoding result. For example, the command CMD may include a read command for the memory cell MC. The bay control circuit 320 may perform operation S110 to operation S150 under control of the command decoder 331 that decodes the read command once.

The address buffer 332 may receive an address ADD from a source located outside of the memory device 300. The address ADD may indicate at least one or more memory cells to be selected from the memory cells of the memory device 300. The address buffer 332 may provide a column address to the column decoder 324 of the bay control circuit 320 controlling the bay 311 including the memory cell MC that the address ADD indicates, and may provide a row address to the row decoder 321 of the bay control circuit 320 controlling the bay 311 including the memory cell MC that the address ADD indicates. The command decoder 331 may select the bay control circuit 320 controlling the bay 311 including the memory cell MC that the address ADD indicates. For example, the command decoder 331 that receives one of a read command and a write command may simultaneously select one or more bay control circuits 320.

The data processing circuit 333 may receive data "DATA" including write data from a source located outside of the memory device 300. The data processing circuit 333 may provide the write data to the selected bay control circuits 320. In each of the selected bay control circuits 320, the read/write control circuit 326 may control the remaining components 321 to 326 to write the write data in the selected memory cell MC. The data processing circuit 333 may receive read data from the selected bay control circuits 320. The data processing circuit 333 may output the data "DATA" including the read data. In each of the selected bay control circuits 320, the read/write control circuit 326 may control the remaining components 321 to 326 to read the read data from the selected memory cell MC. The read/write control circuit 326 may be implemented by the read/write control circuit 170.

The error correction circuit 334 may perform an encoding operation on write data to be written in the selected memory cell MC based on an error correction code. The error correction circuit 334 may perform a decoding operation on read data read from the selected memory cell MC based on the error correction code. The error correction circuit 334 may detect an error of the read data, may calculate an error count (e.g., the number of error (or fail) bits) of the read data, may determine whether the error of the read data is correctable, or may correct the error of the read data. The error correction circuit 334 may provide the error count of the read data to the data processing circuit 333. For example, the data processing circuit 333 may provide write data encoded by the error correction circuit 334 to the selected bay control circuits 320. The data processing circuit 333 may output the data "DATA" including read data decoded by the error correction circuit 334.

The on cell counter 335 may calculate the number of on cells of the selected memory cells MC based on the read data output from the selected memory cells MC. The on cell counter 335 may provide the number of on cells to the data processing circuit 333. The on cell counter 335 may not be included in the memory device 300. The randomizer 336 may perform a randomization operation on write data to be written in the selected memory cell MC. The randomizer 336 may perform a de-randomization operation on read data read from the selected memory cell MC. For example, when each of the memory cells MC stores one of digital logical values of "0" and "1", the randomizer 336 may adjust a ratio of 1's to 0's of the write data to be written in the selected memory cells MC. The randomizer 336 may calculate a ratio of 1's to 0's of the read data. For example, the randomizer 336 may identify whether the ratio of 1's to 0's of the write data and the ratio of 1's to 0's of the read data are different. The randomizer 336 may provide information about the above ratios to the data processing circuit 333. The randomizer 336 may not be included in the memory device 300.

The registers 337 may store various information about the memory device 300. For example, the registers 337 may store the following information: a result of an operation performed by the error correction circuit 334, an error count calculated by the error correction circuit 334, the number of on cells calculated by the on cell counter 335, information about a ratio calculated by the randomizer 336, the number of bit lines to be biased from among unselected bit lines, the number of bit lines to be floated from among the unselected bit lines, the number of word lines to be biased from among unselected word lines, and the number of word lines to be floated from among the unselected word lines.

The voltage generator 338 may generate various voltages to be used in the memory device 300 by using a power supply voltage supplied to the memory device 300, and may provide the generated voltages to the components 310, 320, and 331 to 338 of the memory device 300. The power supply voltage supplied to the memory device 300 may include VDD, VPP, GND, etc. Various voltages that are used in the memory device 300 may include a non-selection bit line voltage to be applied to an unselected bit line, a non-selection word line voltage to be applied to an unselected word line, a level of a selection voltage (or a precharge voltage) in a read operation or a write operation, a level of a floating voltage, a level of a biasing voltage, the reference voltage level VREF that is used by the sense amplifiers 323, etc.

Figure 15:
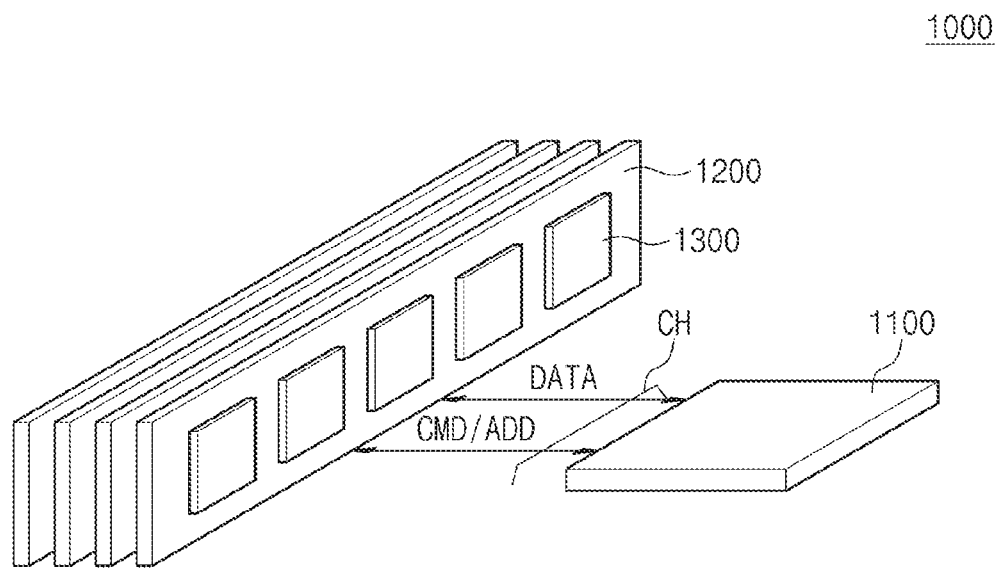
FIG. 15 is a block diagram illustrating an electronic device to which a memory device according to an exemplary embodiment of the inventive concept is applied.

FIG. 15 is a block diagram illustrating an electronic device to which a memory device according to an embodiment of the inventive concept is applied. An electronic device 1000 may be referred to as a "computing system", a "memory system", an "electronic system", or a "communication system". For example, each of the electronic devices 1000 may be a desktop computer, a laptop computer, a tablet computer, a mobile device, a smartphone, a personal digital assistant (PDA), a portable multimedia player (PMP), a wearable device, a video game console, a workstation, a server, a data processing device capable of using or supporting an interface protocol proposed by the mobile industry processor interface (MIPI) alliance, home appliances, a black box, a drone, etc.

Referring to FIG. 15, the electronic device 1000 may include a host 1100 and a memory module 1200. The host 1100 may exchange data with the memory module 1200. For example, the host 1100 may include one or more cores. The host 1100 may include a memory controller that controls the memory module 1200. The memory controller may transmit at least one of a command CMD, an address ADD, and data "DATA" to the memory module 1200 through a channel CH or may receive the data "DATA" from the memory module 1200 through the channel CH.

The memory module 1200 may include a memory device 1300. In the electronic device 1000, the number of memory modules 1200 and the number of memory devices 1300 attached to one memory module 1200 are not limited to the example of FIG. 15. The memory module 1200 may be a single in-line module (SIMM) or a dual in-line memory module (DIMM). The memory devices 1300 may include at least one of the memory devices 100 to 300 described with reference to FIGS. 1, 13, and 14, a static random access memory (SRAM) device, a dynamic RAM (DRAM) device, a thyristor RAM (TRAM) device, a NAND flash memory device, a NOR flash memory device, a resistive RAM (RRAM), and a ferroelectric RAM (FRAM), and the number of kinds of memory devices 1300 may be one or more. For example, the memory module 1200 may be a SIMM, a DIMM, a registered DIMM (RDIMM), a load reduced DIMM (LRDIMM), an unbuffered DIMM (UDIMM), a fully buffered DIMM (FB-DIMM), a small outline DIMM (SO-DIMM), a non-volatile DIMM (NVDIMM), etc.

The memory module 1200 may be connected to the host 1100 through a DDR interface. In an embodiment, the DDR interface may comply with a memory standard specification of a joint electron device engineering council (JEDEC). Meanwhile, the memory module 1200 may be connected to the host 1100 based on the DDR interface. However, the inventive concept is not limited thereto. The memory module 1200 may be connected to the host 1100 through various kinds of communication interfaces except for the DDR interface. For example, the communication interfaces may include a non-volatile memory express (NVMe) interface, a peripheral component interconnect express (PCIe) interface, a serial at attachment (SATA) interface, a small computer system interface (SCSI), a serial attached SCSI (SAS), a universal storage bus (USB) attached SCSI (UAS), an internet small computer system interface (iSCSI), a Fiber Channel interface, and a fiber channel over ethernet (FCoE)

Figure 16:
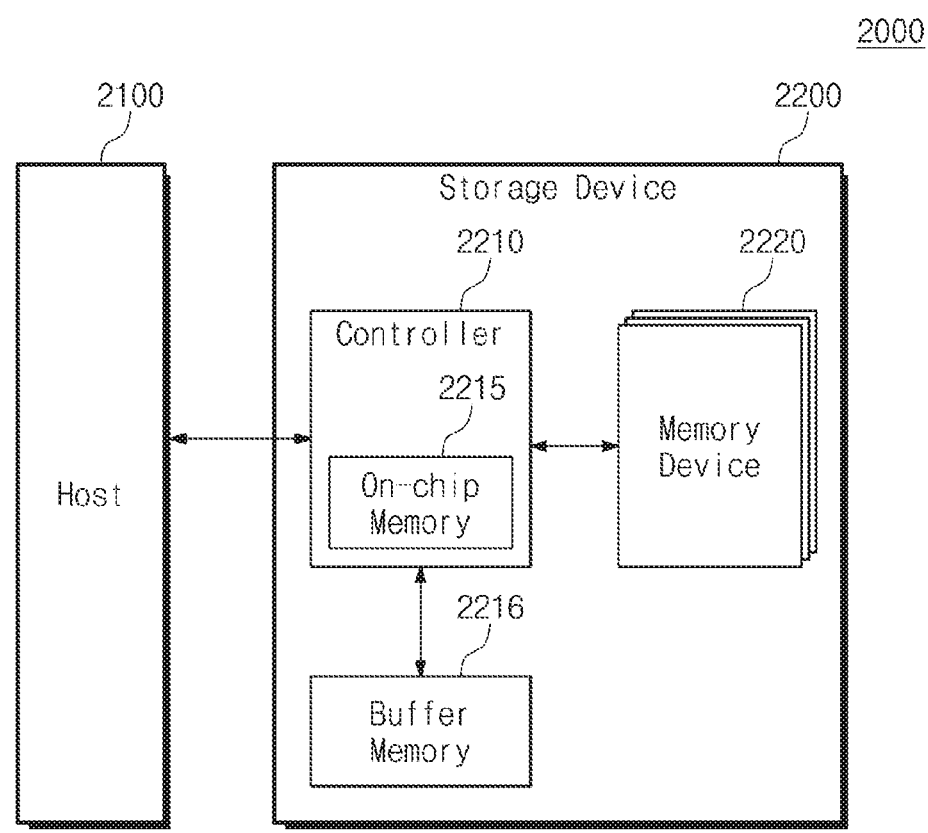
FIG. 16 is a block diagram illustrating a computing system according to an exemplary embodiment of the inventive concept.

FIG. 16 is a block diagram illustrating a computing system according to an exemplary embodiment of the inventive concept. Referring to FIG. 16, an electronic device 2000 includes a host 2100 and a storage device 2200. The host 2100 may exchange data with the storage device 2200. The storage device 2200 may include a controller 2210 including an on-chip memory 2215, memory devices 2220, and a buffer memory 2216. The controller 2210 may process a request of the host 2100, may execute a program loaded onto the on-chip memory 2215, and may control the memory devices 2220. The on-chip memory 2215, the buffer memory 2216, and the memory devices 2220 may include at least one of the memory devices 100 and 200 described with reference to FIGS. 1 and 14, an SRAM device, a DRAM device, a TRAM device, a NAND flash memory device, a NOR flash memory device, an RRAM device, a FRAM device, and an MRAM device.

In an embodiment, in the case where the memory devices 2220 are NAND flash memory devices and the buffer memory 2216 is one of the memory devices 100, 200, and 300 described with reference to FIGS. 1, 13, and 14, the buffer memory 2216 may store meta data of the memory devices 2220. For example, the storage device 2200 may be a solid state drive (SSD) device, a memory card capable of being attached to or detached from the electronic device 2000, a secure digital (SD) card, an embedded multimedia card (eMMC), a universal flash storage (UFS) card, etc.

A memory device according to at least one exemplary embodiment of the inventive concept may reduce a leakage current flowing at unselected memory cells in a read or write operation associated with a selected memory cell, and thus, the reliability or endurance of memory cells may be improved.

A memory module according to at least one exemplary embodiment of the inventive concept may reduce power consumption by biasing memory cells adjacent to selected memory cells.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A method of performing an access operation on a memory cell of a memory device connected to a first word line among a plurality of word lines and a first bit line among plurality of bit lines, the method comprising:
   biasing at least one word line of the word lines adjacent to the first word line to a level of a first non-selection row voltage and floating remaining non-adjacent word lines of the plurality of word lines not adjacent to the first word line to a level of a second non-selection row voltage;
   applying an initial voltage to the bit lines during a standby phase;
   biasing at least one bit line of the bit lines adjacent to the first bit line to a level of a first non-selection column voltage greater than the initial voltage during a bias phase after the standby phase and remaining non-adjacent bit lines of the plurality of bit lines not adjacent to the first bit line to a level of a second non-selection column voltage lower than the initial voltage during the bias phase; and
   floating the remaining non-adjacent bit lines.

2. The method of claim 1, further comprising:
   applying a voltage to a gate of a first transistor of the memory device and a gate of a second transistor of the memory device, when the access operation is a write operation,
   wherein the first and second transistors are connected to a first non-adjacent word line of the remaining non-adjacent word lines.

3. The method of claim 2, further comprising: applying a voltage of a logical high level to the gate of the first transistor and applying a voltage of a logical low level to the gate of the second transistor, and floating the first non-adjacent word line to the level of the second non-selection row voltage.

4. The method of claim 2, further comprising:
   sensing, by a sense amplifier, a level of a read voltage of the first word line when the access operation is a read operation; and
   turning on a third transistor in the read operation to connect the first word line to the sense amplifier,
   wherein the third transistor is connected between the sense amplifier and the first word line.

5. The method of claim 1, wherein the number of the plurality of word lines are greater than or equal to the number of the plurality of bit lines.

6. The method of claim 1, wherein a capacitance value of the first bit line is greater than a capacitance value of the first word line.

7. The method of claim 1, wherein the memory cell is a phase-change random access memory (PRAM) cell.

8. A method of performing an access operation on a memory cell array comprising first to third word lines, first to third bit lines, and a memory cell connected to the first word line and the first bit line, wherein the second word line is interposed between the first and third word lines and the second bit line is interposed between the first and third bit lines, the method comprising:
   applying a first selection row voltage to the first word line, to bias the second word line to a level of a first non-selection row voltage, and to float the third word line to a level of a second non-selection row voltage, in a write operation;
   applying a first selection column voltage to the first bit line, to bias the second bit line to a level of a first non-selection column voltage, and to float the third bit line to a level of a second non-selection column voltage, in a read operation; and
   sensing, by a sense amplifier, a level of a read voltage of the first word line in the read operation,
   wherein a time when the bias of the second bit line to the level of the first non-selection column voltage and the float of the third bit line to the level of the second non-selection column voltage completes is identical to a time when the sensing of the read voltage of the first word line completes.

9. The method of claim 8, wherein the float of the third word line starts at a time when the second word line starts to be biased in the write operation, and wherein the float of the third bit line starts at a time when the second bit line starts to be biased in the read operation.

10. The method of claim 8, wherein, in the read operation, in at least a portion of a time period where the first selection column voltage is applied to the first bit line, the first word line is floated to a level of the first selection row voltage.

11. The method of claim 8, wherein, in the read operation, while the sense amplifier senses the level of the read voltage of the first word line, the second bit line is biased to the level of the first non-selection column voltage.

12. The method of claim 8, wherein the level of the first non-selection row voltage is different from the level of the first non-selection column voltage.

13. The method of claim 8, wherein the memory cell array further comprises a fourth word line adjacent to the third word line and a fourth bit line adjacent to the third bit line and the method further comprises:
    floating the fourth word line to a level of a third non-selection row voltage different from the level of the second non-selection row voltage, in the write operation; and
    floating the fourth bit line to a level of a third non-selection column voltage different from the level of the second non-selection column voltage, in the read operation.

14. The method of claim 13, further comprising:
    floating the fourth word line after floating the third word line, in the write operation, and
    floating the fourth bit line after floating the third bit line, in the read operation.

15. A method of performing a read operation on a memory cell of a memory device connected to a first word line and a first bit line, the method comprising:
    precharging the first word line to a level of a first selection row voltage;
    floating the first word line;
    precharging the first bit line to a level of a first selection column voltage;
    biasing a second bit line adjacent to the first bit line to a level of a first non-selection column voltage and floating a third bit line not adjacent to the first bit line to a level of a second non-selection column voltage;
    floating the first bit line; and
    sensing a level of a read voltage of the first word line,
    wherein a time when the biasing of the second bit line to the level of the first non-selection column voltage and the floating of the third bit line to the level of the second non-selection column voltage completes is identical to a time when the sensing of the read voltage of the first word line completes.

16. The method of claim 15, wherein the biasing of the second bit line to the level of the first non-selection column voltage and the floating of the third bit line to the level of the second non-selection column voltage starts at the same time with the precharging of the first bit line to the level of the first selection column voltage.

17. The method of claim 15, wherein the biasing of the second bit line to the level of the first non-selection column voltage and the floating of the third bit line to the level of the second non-selection column voltage comprises:
    controlling gate voltages of first transistors connected to the second bit line; and
    controlling gate voltages of second transistors connected to the third bit line.

18. The method of claim 15, wherein the precharging of the first bit line to the level of the first selection column voltage comprises charging a capacitor of the first word line with charges.

19. The method of claim 18, wherein the sensing of the level of the read voltage of the first word line comprises:
    sensing a voltage of the capacitor at the same time when the first bit line is floated or after the first bit line is floated.

20. The method of claim 1, wherein the at least one adjacent bit line is not floated after the bias phase.

* * * * *